US012525574B2

(12) United States Patent
Sun et al.

(10) Patent No.: US 12,525,574 B2
(45) Date of Patent: Jan. 13, 2026

(54) THREE-DIMENSIONAL (3D) INTEGRATED CIRCUIT (IC) (3DIC) PACKAGE WITH A BOTTOM DIE LAYER EMPLOYING AN EXTENDED INTERPOSER SUBSTRATE, AND RELATED FABRICATION METHODS

(71) Applicant: QUALCOMM Incorporated, San Diego, CA (US)

(72) Inventors: Yangyang Sun, San Diego, CA (US); Stanley Seungchul Song, San Diego, CA (US); Lily Zhao, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 507 days.

(21) Appl. No.: 17/655,394

(22) Filed: Mar. 18, 2022

(65) Prior Publication Data

US 2023/0299048 A1 Sep. 21, 2023

(51) Int. Cl.
*H01L 25/065* (2023.01)
*H01L 23/00* (2006.01)
*H01L 25/00* (2006.01)

(52) U.S. Cl.
CPC .......... *H01L 25/0657* (2013.01); *H01L 25/50* (2013.01); *H01L 24/13* (2013.01); *H01L 24/14* (2013.01); *H01L 2224/13025* (2013.01); *H01L 2224/1403* (2013.01); *H01L 2224/14181* (2013.01); *H01L 2225/06513* (2013.01); *H01L 2225/06517* (2013.01); *H01L 2225/06541* (2013.01); *H01L 2225/06586* (2013.01)

(58) Field of Classification Search
CPC ..... H01L 25/0657; H01L 25/50; H01L 24/13; H01L 24/14; H01L 2224/13025; H01L 2224/1403; H01L 2224/14181; H01L 2225/06513; H01L 2225/06517; H01L 2225/06541; H01L 2225/06586; H01L 2225/06548; H01L 24/17; H01L 25/0652
See application file for complete search history.

(56) References Cited

U.S. PATENT DOCUMENTS

2014/0332975 A1* 11/2014 Raorane .................. H01L 24/19 438/109
2018/0358298 A1* 12/2018 Zhai .................... H01L 21/4853
2022/0278032 A1* 9/2022 Pietambaram ...... H01L 23/5385
2023/0085196 A1* 3/2023 Akkinepally ........... H01L 24/25 257/737
2023/0197661 A1* 6/2023 Darmawikarta ........ H01L 25/18 257/770

* cited by examiner

*Primary Examiner* — Antonio B Crite
(74) *Attorney, Agent, or Firm* — W&T/Qualcomm Incorporated

(57) ABSTRACT

A three-dimensional (3D) integrated circuit (IC) (3DIC) package with a bottom die layer employing an interposer substrate, and related fabrication methods. To facilitate the ability to fabricate the 3DIC package using a top die-to-bottom wafer process, a bottom die layer of the 3DIC package includes an interposer substrate. This interposer substrate provides support for a bottom die(s) of the 3DIC package. The interposer substrate is extended in length to be longer in length than the top die. The interposer substrate provides additional die area in the bottom die layer in which a larger length, top die can be bonded. In this manner, the bottom die layer, with its extended interposer substrate, can be formed in a bottom wafer in which the top die can be bonded in a top die-to-bottom wafer fabrication process.

7 Claims, 17 Drawing Sheets

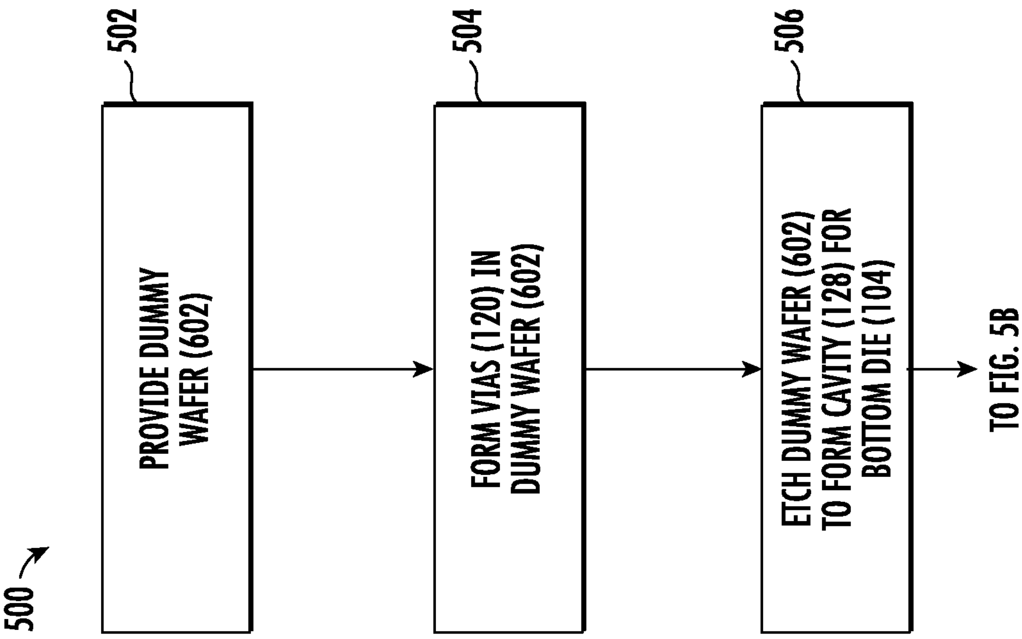
FIG. 5A
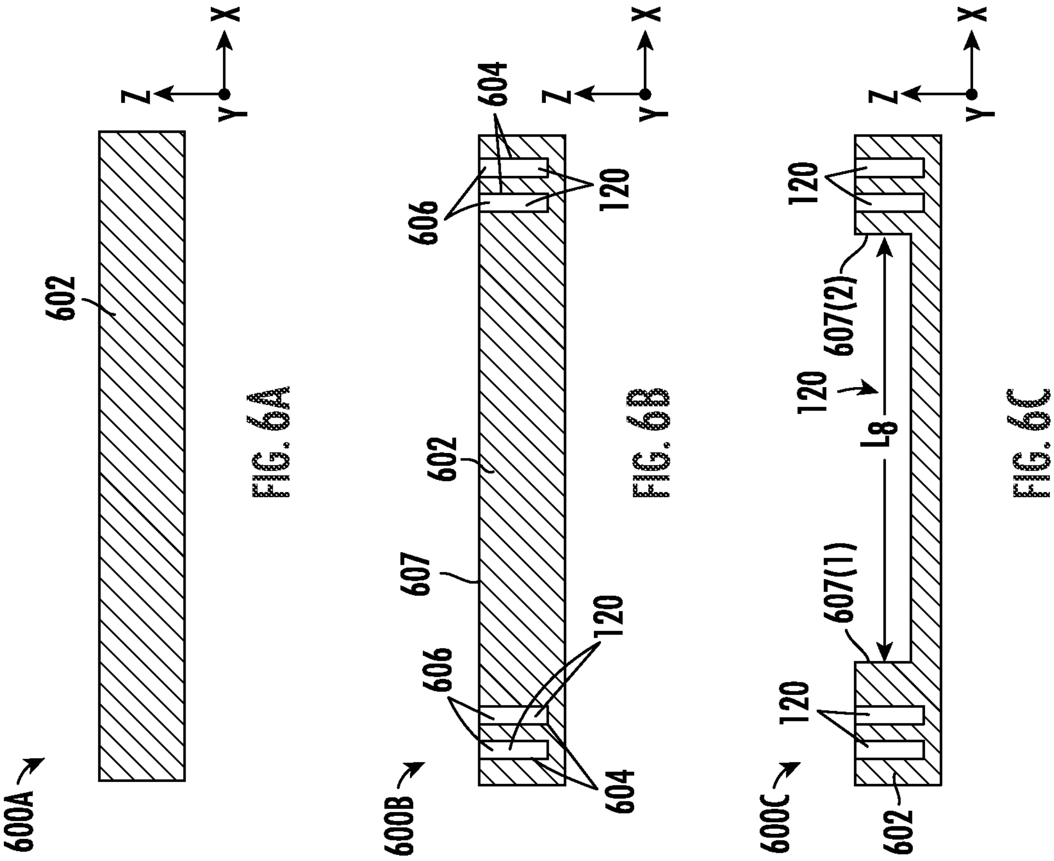
FIG. 6A
FIG. 6B
FIG. 6C

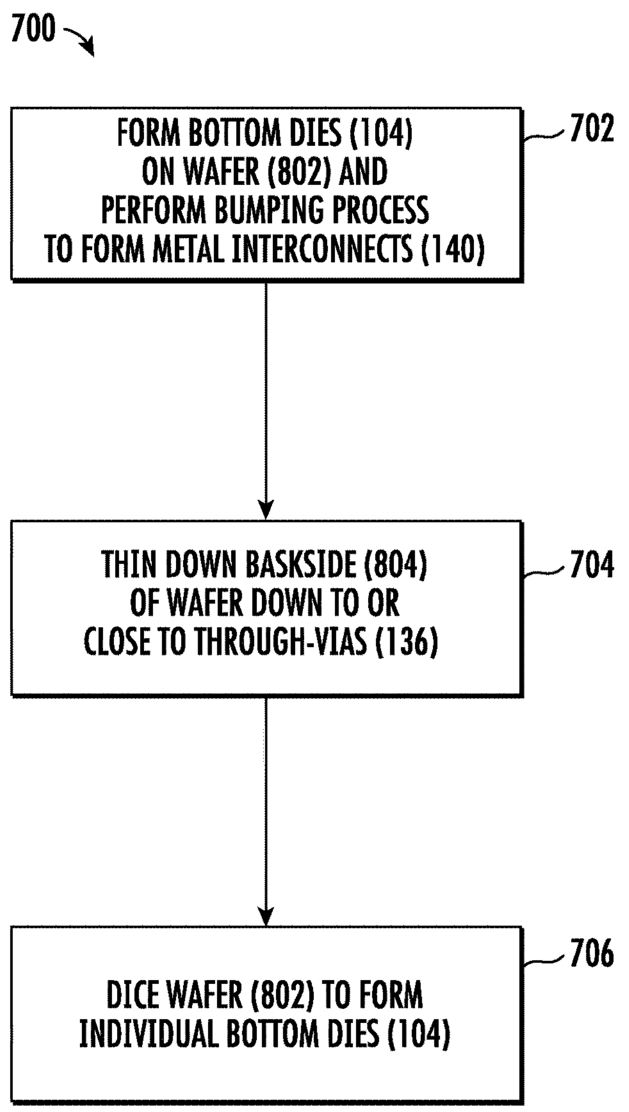
FIG. 7
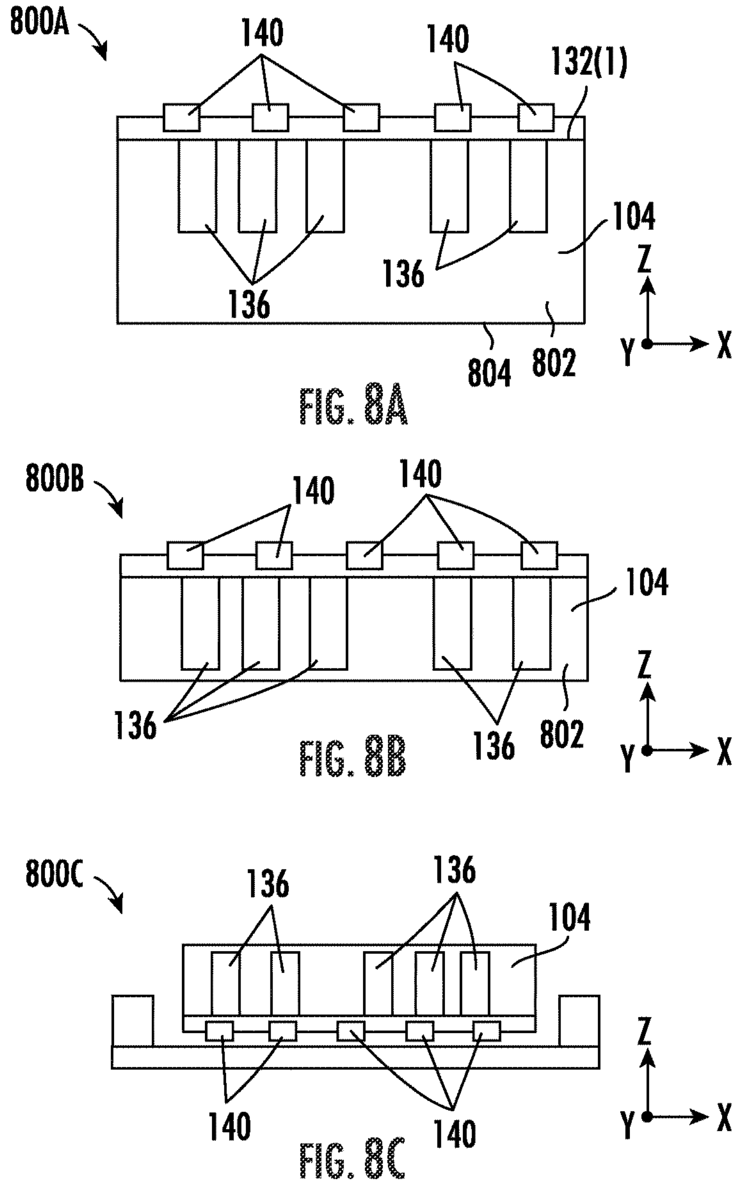
FIG. 8A
FIG. 8B
FIG. 8C

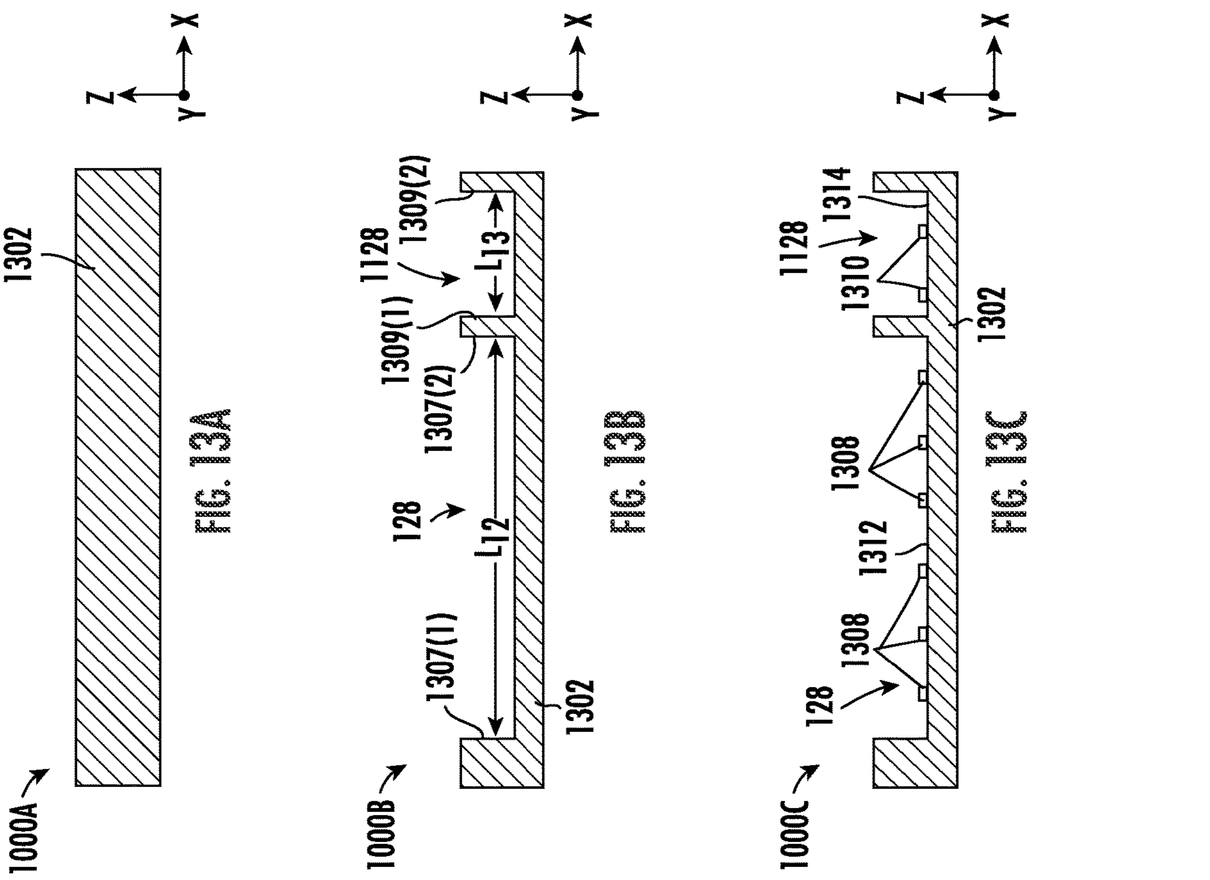
FIG. 13A
FIG. 13B
FIG. 13C
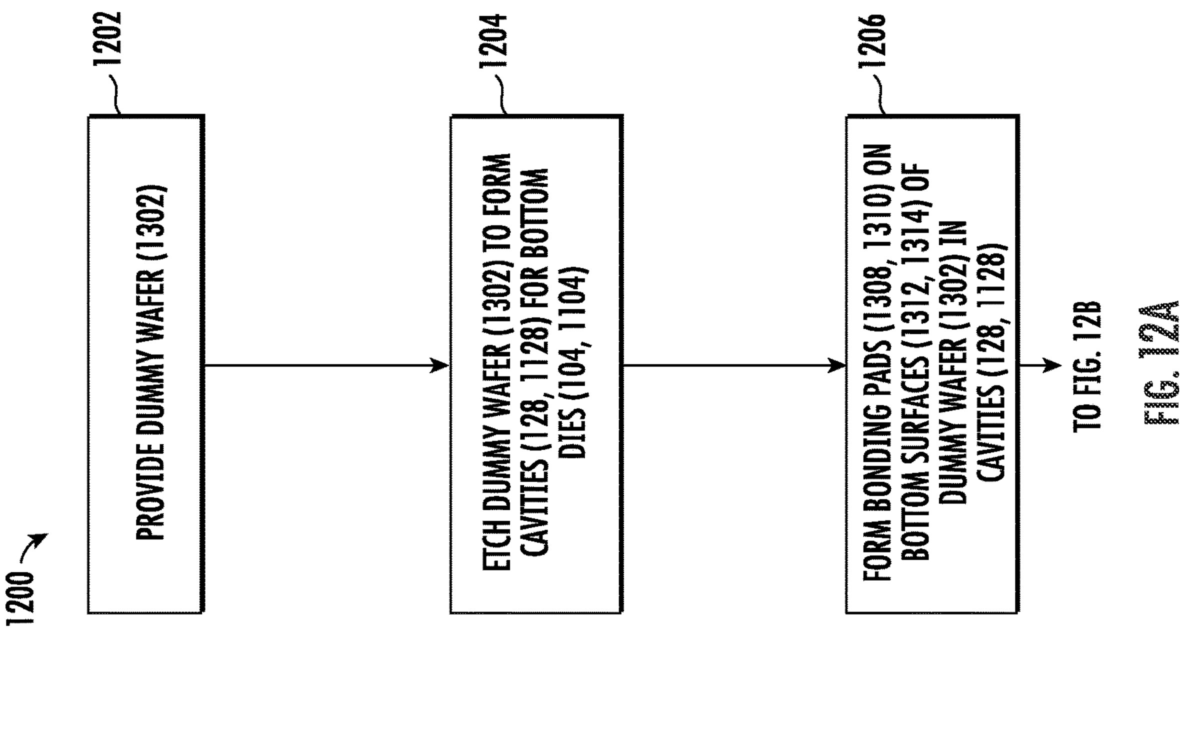
FIG. 12A

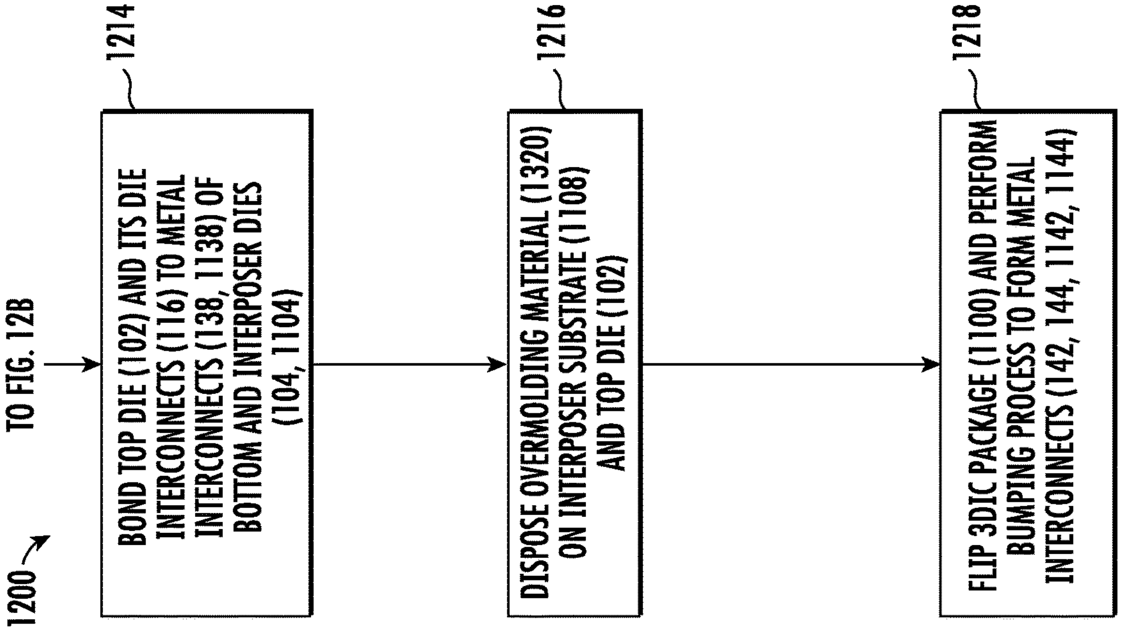
FIG. 12C
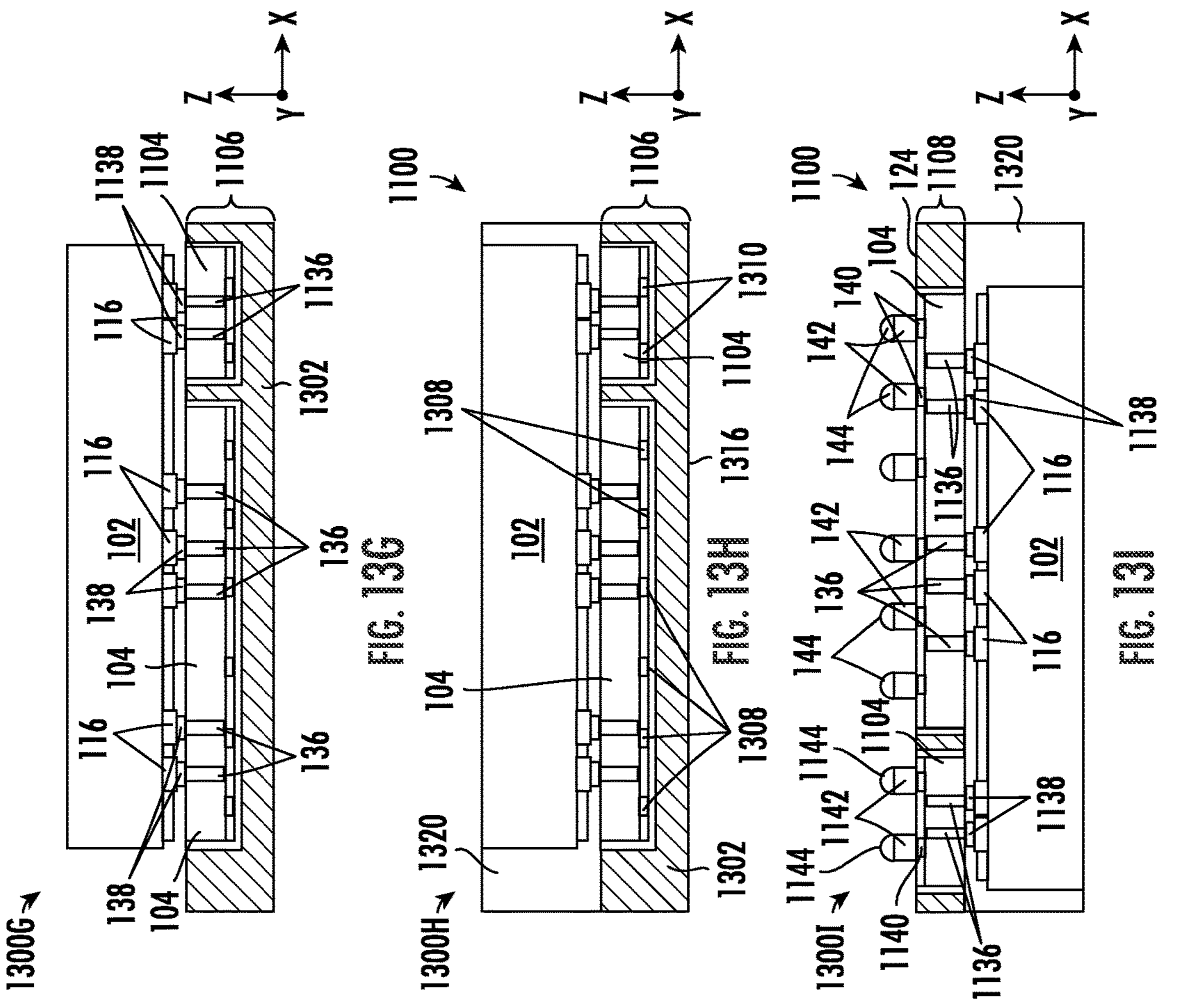
FIG. 13G
FIG. 13H
FIG. 13I

THREE-DIMENSIONAL (3D) INTEGRATED CIRCUIT (IC) (3DIC) PACKAGE WITH A BOTTOM DIE LAYER EMPLOYING AN EXTENDED INTERPOSER SUBSTRATE, AND RELATED FABRICATION METHODS

BACKGROUND

I. Field of the Disclosure

The field of the disclosure relates to integrated circuit (IC) packages, and more particularly to three-dimensional (3D) IC packages that include multiple stacked semiconductor dies.

II. Background

Integrated circuits (ICs) are the cornerstone of electronic devices. ICs are packaged in an IC package, also called a "semiconductor package" or "chip package." The IC package includes one or more semiconductor dice ("dies" or "dice") as an IC(s) that is mounted on and electrically coupled to a package substrate to provide physical support and an electrical interface to the die(s). The package substrate includes one or more metallization layers that include electrical traces (e.g., metal lines) with vias coupling the electrical traces together between adjacent metallization layers to provide electrical interfaces between the die(s). The die(s) is electrically interfaced to metal interconnects exposed in a top or outer layer of the package substrate to electrically couple the semiconductor die(s) to the electrical traces of the package substrate. The package substrate includes an outer metallization layer coupled to external metal interconnects (e.g., solder bumps) to provide an external interface between the die(s) in the IC package for mounting the IC package on a circuit board to interface the die(s) with other circuitry.

Some IC packages are known as "hybrid" IC packages which include multiple dies for different purposes or applications. For example, a hybrid IC package may include a modem die as part of a front-end circuitry for supporting a communications interface. The hybrid IC package could also include one or more memory dies that provide memory to support data storage and access by the modem die, such as for buffering and outgoing data to be modulated and/or demodulated data. Thus, in these hybrid IC packages, it is conventional to stack the multiple dies on top of each other in a second, vertical direction in the IC package as a three-dimensional (3D) stack to provide a 3DIC package to conserve area consumed by the IC die package in the first, horizontal directions. In a 3DIC package, the bottom-most die that is directly adjacent to the package substrate of the IC package is electrically coupled through die interconnects to metal interconnects in an upper metallization layer of the package substrate. Other stacked dies that are not directly adjacent to the package substrate of the IC package are also coupled to the package substrate. For example, other stack dies can be electrically coupled by wire bonds to the package substrate, or coupled by through-silicon vias (TSVs) that extend through an intermediate die layer(s) and/or bottom die layer to the package substrate. External connections to the dies are formed through electrical connections in the package substrate. Also, die-to-die (D2D) connections between the stacked dies are formed through electrical connections in the package substrate.

A 3DIC package can be in a bottom-greater-than-top (BGT) die configuration, or a top-greater-than-bottom (TGB) die configuration. In a 3DIC package in a BOT die configuration, a bottom die in a bottom die layer of the 3DIC package is greater in length in a first, horizontal direction than a top die in a top die layer stacked on the bottom die layer. In a 3DIC package in a TGB die configuration, a bottom die in a bottom die layer of the 3DIC package is less in length in the first, horizontal direction than a top die in a top die layer stacked on the bottom die layer. A BGT 3DIC package may be easier to fabricate than a TGB 3DIC package, because in a BGT 3DIC package, the bottom die layer, with its larger length die, can be fabricated as part of a bottom wafer. The top die can then be bonded to the bottom wafer in a top die-to-bottom wafer bonding process. The stacked top die and bottom die structure can then be diced. An overmold material does not have to be employed in the bottom die layer to fill in gaps that would otherwise be present if the top die was greater in length than the bottom die. However, in a TGB 3DIC package, a bottom die-to-top wafer bonding process is employed, because the top die is larger in length than the bottom die and can be formed as a top wafer. The bottom die is fabricated separately using a bond carrier that then must be debonded to prepare the bottom die to be bonded to the top wafer. After the bottom dies are bonded to the top wafer, the package is flipped and diced to form TGB 3DIC packages. The bottom die-to-top wafer bonding process employed in a TGB 3DIC package is more complex with more process steps than a top die-to-bottom wafer bonding process employed in a BUT 3DIC package.

SUMMARY OF THE DISCLOSURE

Aspects disclosed herein include a three-dimensional (3D) integrated circuit (IC) (3DIC) package with a bottom die layer employing an extended interposer substrate wafer. Related fabrication methods are also disclosed. The 3DIC package includes a first, bottom die layer that has a first semiconductor die(s) ("die(s)") and a second, top die layer that has a second, top die stacked in a second, vertical direction on a first, bottom die layer. The second, top die in the top die layer is longer in length than a first, bottom die(s) in the bottom die layer, such that the 3DIC package is in a TGB die configuration. In exemplary aspects, to facilitate the ability for the 3DIC package to be fabricated using a top die-to-bottom wafer process, like employed for example to fabricate a bottom-greater-than-top (BGT) 3DIC package, the bottom die layer in the 3DIC package includes an interposer substrate. The interposer substrate may have been fabricated from a dummy silicon wafer, and thus may be a silicon substrate as an example. The interposer substrate provides support for the first, bottom die(s) as part of the bottom die layer of the 3DIC package. The interposer substrate is extended in length such that the interposer substrate is longer in length than the second, top die. Thus, the interposer substrate provides additional die area in the bottom die layer in which the larger length, top die can be bonded. In this manner, the bottom die layer, with its extended interposer substrate, can formed in a bottom wafer in which the top die can be bonded in a top die-to-bottom wafer fabrication process to fabricate the 3DIC package. A top die-to-bottom wafer fabrication process may involve less process steps and less complexity than a bottom die-to-top wafer fabrication process that is conventionally used to fabricate a 3DIC package.

In other exemplary aspects, the first, bottom die(s) in the bottom die layer of the 3DIC package is disposed in a cavity(ies) formed in the interposer substrate that is sized to receive the first, bottom die(s). The first, bottom die(s) is bonded to the interposer substrate as part of the bottom die layer of the 3DIC package. The interposer substrate is extended in length beyond the cavities such that the interposer substrate is longer in length than the first, bottom die(s) and the second, top die. Metal interconnects such as vias (e.g., through-silicon vias (TSVs)) can be formed vertically in the second direction in the extended portions of the interposer substrate to provide interconnections between the top die through the bottom die layer and to a package substrate or other connection structure in which the 3DIC package is coupled. In another exemplary aspect, a bottom interposer die may be disposed in the extended portions of the interposer substrate to provide an interposer between the first, bottom die layer, and the second, top die. The interposer die can also be disposed in a separately formed cavity in the bottom dummy layer. Vias (e.g., TWO can be formed vertically in the second direction through the interposer die in the bottom die layer to provide interconnections between the top die through the bottom die layer and to a package substrate or other connection structure in Which the 3DIC package is coupled.

In this regard, in one exemplary aspect, an IC package is provided. The IC package comprises a first die layer. The first die layer comprises an interposer substrate extending a first length in a first direction, and a first die disposed in the interposer substrate. The IC package also comprises a second die coupled to the first die layer in a second direction orthogonal to the first direction. The second die extends a second length in the first direction less than the first length of the interposer substrate.

In another exemplary aspect, a method of fabricating an IC package is provided. The method comprises forming a first die layer, comprising: providing interposer substrate extending a first length in a first direction, and disposing a first die in the interposer substrate. The method also comprises coupling a second die to the first die layer in a second direction orthogonal to the first direction, the second die extending a second length in the first direction less than the first length of the interposer substrate.

BRIEF DESCRIPTION OF THE FIGURES

FIGS. 5A-5C is a flowchart illustrating an exemplary fabrication process of fabricating a 3DIC package in a TUB configuration that has a bottom die layer that includes an extended interposer substrate supporting a bottom die(s) to provide additional die area in the bottom die layer in which a larger length, top die can be bonded, vias are disposed vertically in the extended portions of the bottom interposer substrate to provide interconnections between the top die through the bottom die layer;

FIGS. 6A-6I illustrate exemplary fabrication stages according to the exemplary 3DIC fabrication process in FIGS. 5A-5C;

FIG. 7 is a flowchart illustrating an exemplary bottom die fabrication process for fabricating bottom die to be disposed in and bonded to a bottom interposer substrate of a 3DIC package in a TUB configuration, with the bottom, active face of the bottom die bonded to the bottom interposer substrate;

FIGS. 8A-8C illustrate exemplary fabrication stages according to the exemplary bottom die fabrication process in FIG. 7;

FIGS. 12A-12C is a flowchart illustrating an exemplary fabrication process of fabricating a 3DIC package in a TGB configuration that has a bottom die layer that includes an extended interposer substrate supporting a bottom die(s) to provide additional die area in the bottom die layer in which a larger length, top die can be bonded, vias are disposed vertically in the extended portions of the bottom interposer substrate to provide interconnections between the top die through the bottom die layer;

FIGS. 13A-13I illustrate exemplary fabrication stages according to the exemplary 3DIC fabrication process in FIGS. 12A-12C;

DETAILED DESCRIPTION

Figure 1A:
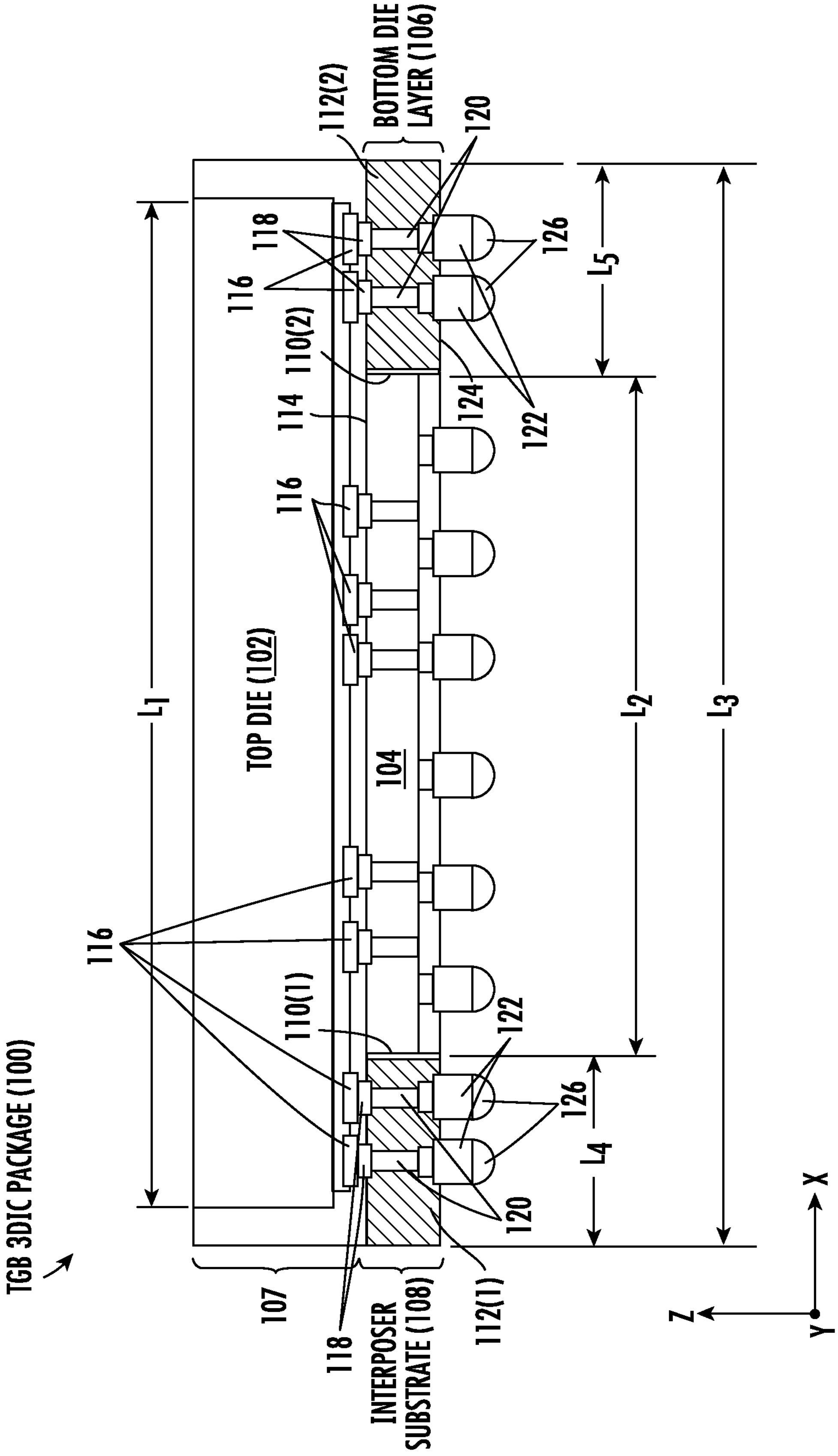
FIGS. 1A and 1B are side views of an exemplary three-dimensional (3D) integrated circuit (IC) (3DIC) package in a top-greater-than-bottom (TUB) configuration, wherein the 3DIC package has a bottom die layer that includes an extended interposer substrate supporting a bottom semiconductor die(s) ("die(s)") to provide additional die area in the bottom die layer in which a larger length, top die can be bonded, and that can be fabricated in top die-to-bottom wafer bonding process.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed herein include a three-dimensional (3D) integrated circuit (IC) (3DIC) package with a bottom die layer employing an extended interposer substrate. Related fabrication methods are also disclosed. The 3DIC package includes a first, bottom die layer that has a first semiconductor die(s) ("die(s)") and a second, top die layer that has a second, top die stacked in a second, vertical direction on a first, bottom die layer. The second, top die in the top die layer is longer in length than a first, bottom die(s) in the bottom die layer, such that the 3DIC package is in a TUB die configuration. In exemplary aspects, to facilitate the ability for the 3DIC package to be fabricated using a top die-to-bottom wafer process, like employed for example to fabricate a bottom-greater-than-top (BGT) 3DIC package, the bottom die layer in the 3DIC package includes an interposer substrate. The interposer substrate may have been fabricated from a dummy silicon wafer, and thus may be a silicon substrate as an example. The interposer substrate provides support for the first, bottom die(s) as part of the bottom die layer of the 3DIC package. The interposer substrate is extended in length such that the interposer substrate is longer in length than the second, top die. Thus, the interposer substrate provides additional die area in the bottom die layer in which the larger length, top die can be bonded. In this manner, the bottom die layer, with its extended interposer substrate, can be formed in a bottom wafer in which the top die can be bonded in a top die-to-bottom wafer fabrication process to fabricate the 3DIC package. A top die-to-bottom wafer fabrication process may involve less process steps and less complexity than a bottom die-to-top wafer fabrication process that is conventionally used to fabricate a 3DIC package.

In other exemplary aspects, the first, bottom die(s) in the bottom die layer of the 3DIC package is disposed in a cavity(ies) formed in the interposer substrate that is sized to receive the first, bottom die(s). The first, bottom die(s) is bonded to the interposer substrate as part of the bottom die layer of the 3DIC package. The interposer substrate is extended in length beyond the cavities such that the interposer substrate is longer in length than the first, bottom die(s) and the second, top die. Metal interconnects such as vias (e.g., through-silicon vias (TSVs)) can be formed vertically in the second direction in the extended portions of the interposer substrate to provide interconnections between the top die through the bottom die layer and to a package substrate or other connection structure in which the 3DIC package is coupled. In another exemplary aspect, a bottom interposer die may be disposed in the extended portions of the interposer substrate to provide an interposer between the first, bottom die layer, and the second, top die. The interposer die can also be disposed in a separately formed cavity in the bottom dummy layer. Vias (e.g., TSVs) can be formed vertically in the second direction through the interposer die in the bottom die layer to provide interconnections between the top die through the bottom die layer and to a package substrate or other connection structure in which the 3DIC package is coupled.

In this regard, FIG. 1A is a side view of an exemplary three-dimensional (3D) integrated circuit (IC) (3DIC) package 100 (also referred to as "3DIC package 100") in a TGB configuration. By TGB, it is meant that the 3DIC package 100 has top die 102 that is longer in length $L_1$ in a first, horizontal direction(s) (X-axis and/or Y-axis directions) than the length $L_2$ of a bottom die 104 in a first, horizontal direction(s) (X-axis and/or Y-axis directions). As shown in FIG. 1A, the top die 102 is a die that is located above the bottom die 104 in a second, vertical direction (Z-axis direction) orthogonal to the first, horizontal directions (X-axis and/or Y-axis directions) in this example. The top die 102 is disposed in a top die layer 107. However, the orientation of the top die 102 to the bottom die 104 is relative to the orientation of the 3DIC package 100. The bottom die 104 is a first die that is provided as part of a first, bottom die layer 106. The top die 102 is a second die that is stacked on and coupled to the bottom die layer 106 in the second, vertical direction (Z-axis direction) to provide the 3DIC package 100 as a three-dimensional stacked die package in the second, vertical direction (Z-axis direction). A 3DIC package with a TGB die configuration, such as the 3DIC package 100 in FIG. 1A, is fabricated such that the top die 102 having a longer length $L_1$ can be coupled to the bottom die 104. However, by the bottom die 104 having a reduced length $L_2$ from the length of the top die 102 length $L_1$, the conventional fabrication process would be to form the top die 102 in a wafer that is then used for the bottom die 104 to be bonded in a bottom die-to-top wafer bonding process, and then the resulting IC package flipped. However, this conventional fabrication process can involve more process steps and more complexity at a greater cost, than if a bottom die in a 3DIC package had a larger length than a top die in a bottom-greater-than-top (BGT) die configuration. For an IC package in a BTG die configuration, the bottom die can be provided in a wafer for a top die-to-bottom wafer bonding process. In a TGB die configuration, if the bottom die is provided as part of a bottom wafer in which the top die is bonded, there would be additional void area below the top die, between the top and bottom die that is void space which may complicate the ability of the wafer to be diced to form the individual 3DIC package 100.

Thus, as shown in FIG. 1A, to facilitate the ability for the 3DIC package 100 to be fabricated using a top die-to-bottom wafer process that is used for a BGT die configuration, the bottom die layer 106 that the bottom die 104 is disposed in includes a bottom interposer substrate 108 (also referred to as "interposer substrate 108"). The interposer substrate 108 may have been fabricated from a dummy wafer as an example. The interposer substrate 108 may be a semiconductor material that is formed as a wafer during a fabrication process. For example, the interposer substrate 108 may be made from silicon to provide a silicon interposer substrate 108 as an example. The interposer substrate 108 provides support for the bottom die 104, which is less in length $L_2$ than the length $L_3$ of the interposer substrate 108, as part of the bottom die layer 106 of the 3DIC package 100. The interposer substrate 108 has the length $L_3$ that is extended from outer sides 110(1), 110(2) of the bottom die 104 in a first, horizontal direction(s) (X-axis and/or Y-axis direction(s)). The interposer substrate 108 has interposer substrate extension portions 112(1), 112(2) that extend from respective outer sides 110(1), 110(2) of the bottom die 104 in the first, horizontal direction (Z-axis direction) in this example by respective lengths $L_4$, $L_5$. The length $L_1$ of the top die 102 is less than length $L_3$ of the interposer substrate 108. In this manner, the interposer substrate 108 of the bottom die layer 106 provides additional die area in the bottom die layer 106 and provides a wafer in which the larger length $L_1$ top die 102 can be bonded in a top die-to-bottom wafer fabrication process conventionally used for an 3DIC package having a BGT die configuration.

In this manner, the bottom die layer 106 in the 3DIC package 100, with its extended interposer substrate 108, can be formed in a bottom wafer in which the top die 102 can be bonded in a top die-to-bottom wafer fabrication process to fabricate the 3DIC package 100. A top die-to-bottom wafer fabrication process may involve less process steps and less complexity than a bottom die-to-top wafer fabrication process that is conventionally used to fabricate a 3DIC package in a TGB configuration. Because the 3DIC package 100 includes the bottom interposer substrate 108 to provide additional die area for the top die 102 to be coupled, void area below the top die, and between the top and bottom die is not present, which if otherwise present, might complicate the ability to dice the wafer to form the individual 3DIC package 100. Note that multiple bottom dies 104 may have been disposed in a dummy wafer to form a reconstituted wafer, that is then processed into the interposer substrate 108. Then, after the top die 102 is coupled to the interposer substrate 108, the multiple packages can be diced to form multiple of the 3DIC packages 100 as part of a fabrication process.

With continuing reference to FIG. 1A, in this example, the interposer substrate 108 of the bottom die layer 106 has a first surface 114 that is adjacent to the top die 102. Die interconnects 116 of the top die 102 are coupled to metal interconnects 118 (e.g., solder bumps, ball-grid-array (BGA) interconnects) that are exposed from the first surface 114 of the interposer substrate 108 to provide signal routing paths between the top die 102 and the interposer substrate 108. The coupling of the die interconnects 116 of the top die 102 to the metal interconnects 118 of the interposer substrate 108 provide an electrical coupling between the top die 102 and the interposer substrate 108. In this example, to provide electrical signal paths between the interposer substrate 108 of the bottom die layer 106 and the top die 102, vias 120 (e.g., metal posts, metal pillars) are formed in the interposer substrate extension portions 112(1), 112(2) of the interposer substrate 108. For example, the vias 120 could be through-silicon-vias (TSVs) that are formed in the interposer substrate 108 as a silicon substrate. The vias 120 are also coupled to metal interconnects 122 (e.g., metal posts, metal pillars, ball-grid-array (BGA) interconnects) that are exposed from a second surface 124 (on the opposite side of the first surface 114 in the second, vertical direction (Z-axis direction)) of the interposer substrate 108 to be coupled to another structure, such as a package substrate or printed circuit board (PCB). Solder bumps 126 may be formed on the metal interconnects 122.

Figure 1B:
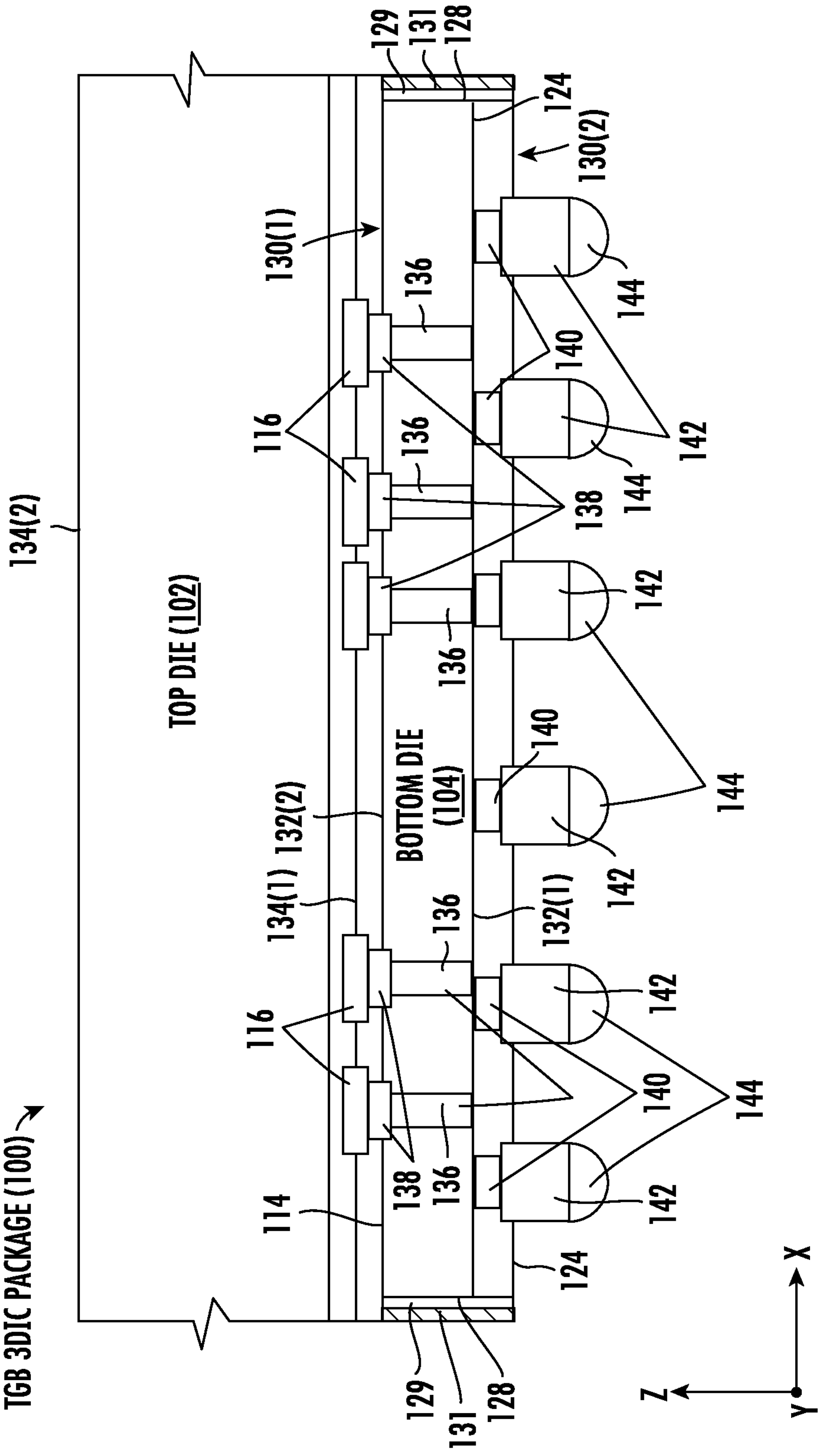

FIG. 1B is a close-up side view of the 3DIC package 100 in FIG. 1A to illustrate additional detail. With reference to FIG. 1B, in this example, the bottom die 104 is disposed in a cavity 128 in the interposer substrate 108. The cavity 128 may have been formed in the interposer substrate 108 during fabrication of the 3DIC package 100 as part of preparing the bottom die layer 106 in a wafer. A passivation layer 129 (e.g., a dielectric material layer) is disposed on inner walls 131 of the interposer substrate 108 to isolate the bottom die 104 from the interposer substrate 108. The cavity 128 extends between and through the first and second surfaces 114, 124 of the interposer substrate 108 in this example, such that the cavity 128 has respective first and second openings 130(1), 130(2) adjacent to the first and second surfaces 114, 124 of the interposer substrate 108. In this example, the bottom die 104 has an inactive face 132(2) that is exposed from the first opening 130(1) of the cavity 128 to be adjacent to and coupled to an active face 134(1) of the top die 102. In this manner, the 3DIC package 100 in FIG. 1B has an active face-to-inactive face bonding configuration between the top die 102 and the bottom die 104. However, note that the bottom die 104 could be flipped such that its active face 132(1) is adjacent to and coupled to the active face 134(1) of the top die 102 to provide active face-to-active face bonding configuration between the top die 102 and the bottom die 104. Also as shown in FIG. 1B, the top die 102 has an inactive face 134(2) that is disposed on an opposite side of its active face 134(1) in the second, vertical direction (Z-axis direction).

With continuing reference to FIG. 1B, in this example, through-vias 136 (e.g., metal posts, metal pillars) are formed in a second, vertical direction (Z-axis direction) through the bottom die 104 to provide additional signal paths to the top die 102. For example, the through-vias 136 could be TSVs. In this regard, as shown in FIG. 1B, certain die interconnects 116 of the top die 102 that are aligned with the bottom die 104 in the second, vertical direction (Z-axis direction) are coupled to metal interconnects 138 (e.g., solder bumps, BGA interconnects) exposed from the first surface 114 of the interposer substrate 108. The metal interconnects 138 are coupled to the respective through-vias 136. Metal interconnects 140 (e.g., solder bumps, BGA interconnects) exposed from the second surface 124 of the interposer substrate 108 are coupled to the respective through-vias 136 to provide signal routing paths between the top die 102, through the bottom die 104, and to the metal interconnects 140 exposed from the second surface 124 of the interposer substrate 108. The metal interconnects 140 are coupled to other metal interconnects 142 (e.g., metal posts, metal pillars, BGA interconnects) that may have metal interconnects 144 (e.g., solder bumps) formed thereon to be able to be coupled to another structure, such as a package substrate or PCB.

Figure 2:
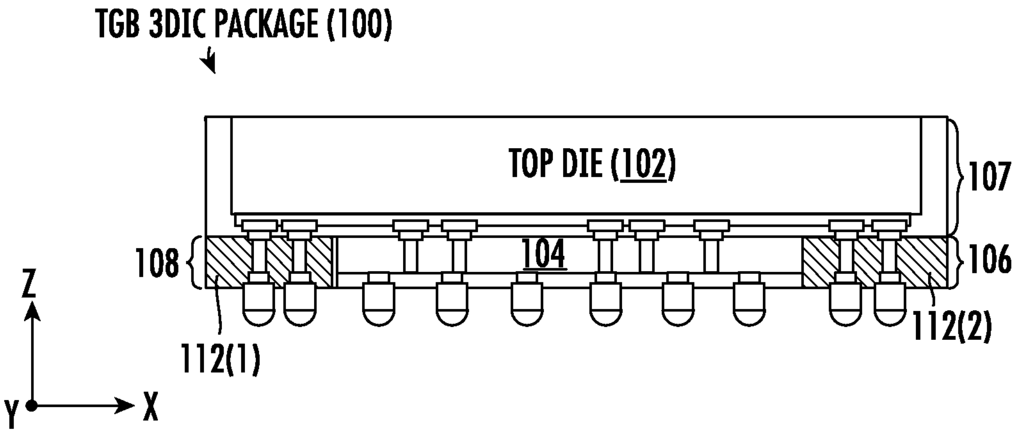
FIG. 2 is a side view of the 3DIC package in FIGS. 1A and 1B.
Figure 3:
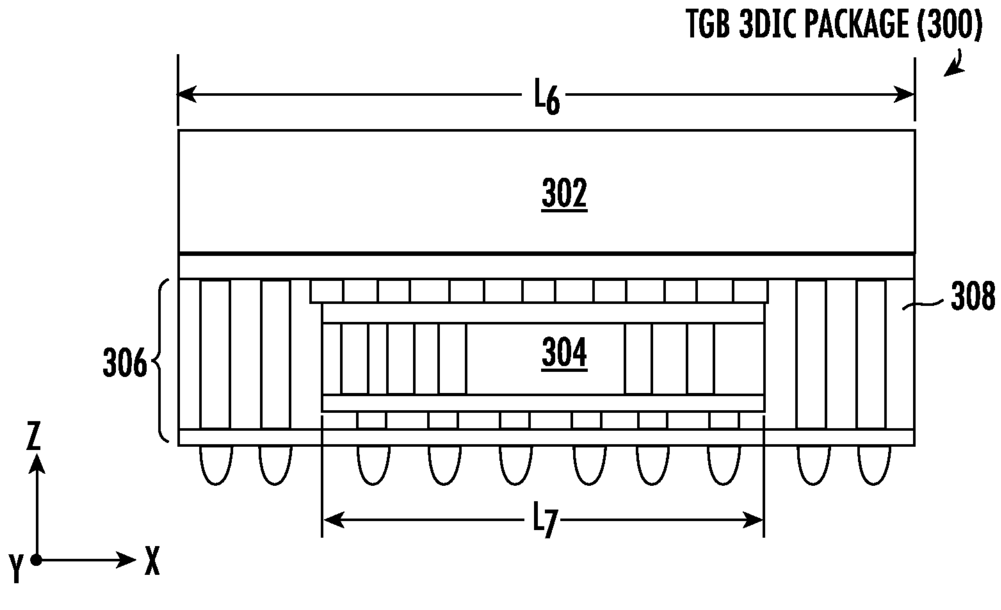
FIG. 3 is a side view of an alternative 3DIC package in a TGB configuration that was fabricated by a bottom die-to-top wafer bonding process, wherein the 3DIC package has a bottom die layer that includes a bottom die surrounded by an overmold material and a larger length, top die bonded to the bottom die layer.

FIG. 2 is a side view of the 3DIC package 100 in FIGS. 1A and 1B, as compared to a 3DIC package 300 in FIG. 3 that does not include an extended interposer substrate to providing additional die area in which a top die can be bonded. As shown in 3DIC package 300 in FIG. 3, a top die 302 of a length $L_6$ in a first, horizontal direction (X-axis direction) is bonded to a bottom die layer 306 that has a bottom die 304 of length $L_7$ that is less than length $L_6$. The bottom die layer 306 does not have the additional die area for bonding the top die 302. Thus, the 3DIC package 300 in FIG. 3 was fabricated in bottom die-to-top wafer bonding process using a wafer in which the top die 302 was formed, to provide a coupling area for the bottom die 104. The top die 302 is fabricated in a wafer in a flipped configuration from shown in FIG. 3, and the bottom die 304 is coupled to the top die 302. To fill in the void area in the bottom die layer 306 not consumed by the bottom die 304, an overmolding material 308 is disposed on the bottom die 304 when coupled to the top die 302 in a flipped configuration. The 3DIC package 300 is then flipped. As discussed above and discussed in more detail below, the 3DIC package 100 in FIGS. 1A-2 is in a TGB die configuration, hut the interposer substrate 108 provides additional die area in its bottom die layer 106 to fabricate the 3DIC package 100 using a top die-to-bottom wafer bonding process.

Figure 4:
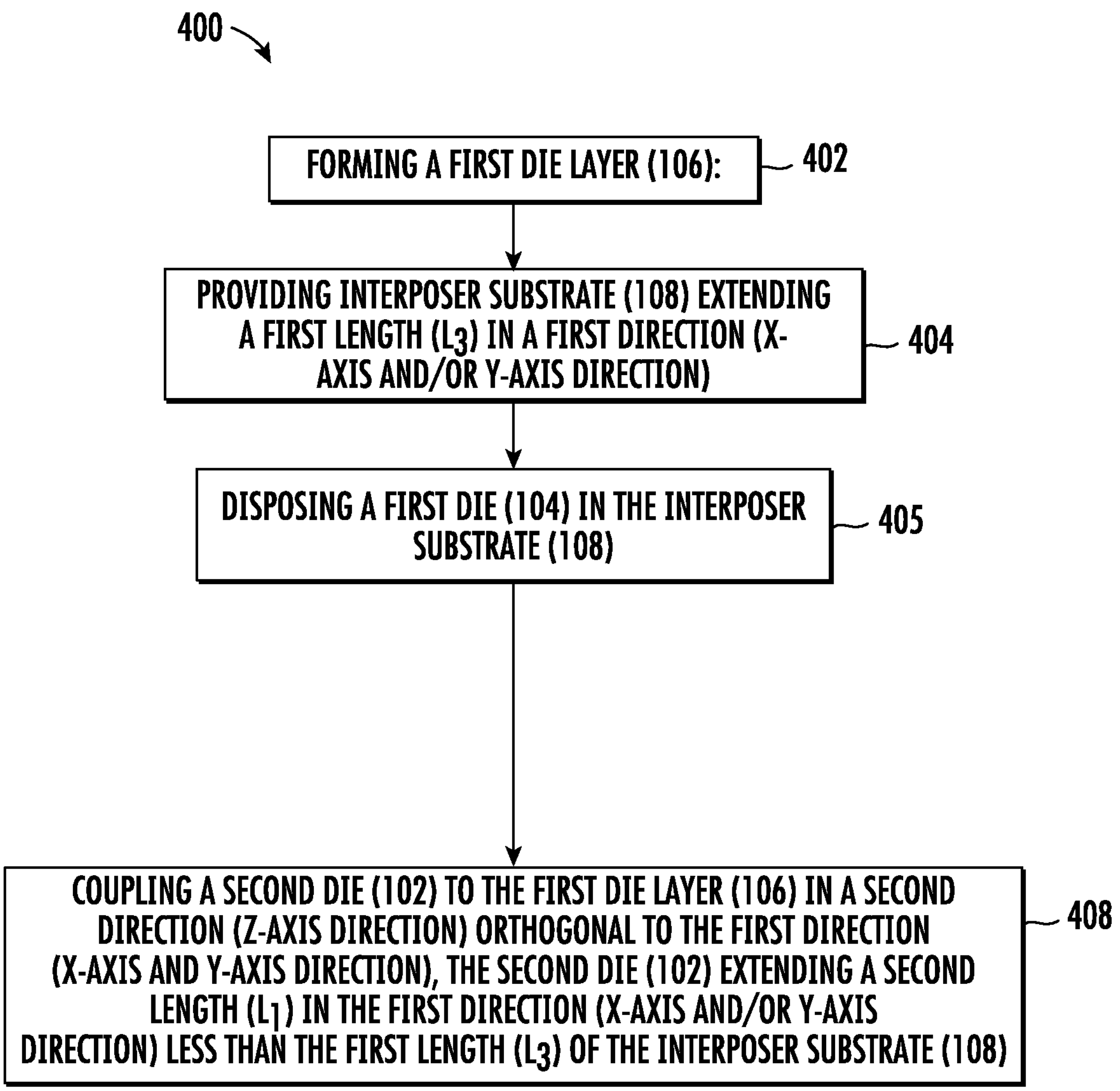
FIG. 4 is a flowchart illustrating an exemplary process of fabricating the 3DIC package in FIGS. 1A and 1B that that has a bottom die layer that includes an extended interposer substrate supporting a bottom semiconductor die(s) ("die(s)") to provide additional die area in the bottom die layer in which a larger length, top die can be bonded.

FIG. 4 is a flowchart illustrating an exemplary fabrication process 400 of fabricating a 3DIC package in a TGB configuration that has a bottom die layer that includes an extended interposer substrate supporting a bottom die to provide additional die area in the bottom die layer in which a larger length, top die can be bonded. The exemplary fabrication process 400 in FIG. 4 could be employed to fabricate 3DIC package 100 in FIG. 1 as an example. In this regard, fabrication process 400 in FIG. 4 will be discussed in conjunction with the 3DIC package 100 in FIG. 1 as an example.

In this regard, as shown in FIG. 4, a first step in the fabrication process 400 can be forming a first, bottom die layer 106 (block 402 in FIG. 4). Fabricating the bottom die layer 106 can include the steps of providing an interposer substrate (108) extending a first length ($L_3$) in a first, horizontal direction (X-Axis and/or Y-axis direction) (block 404 in FIG. 4), and disposing a first die (104) in the interposer substrate (108) (block 406 in FIG. 4). A next step in the fabrication process 400 can include coupling a second die (102) to the first die layer (106) in a second, vertical direction (Z-axis direction) orthogonal to the first, horizontal direction (X-Axis and Y-axis direction), the second die (102) extending a second length ($L_1$) in the first, horizontal direction (X-axis and/or Y-axis direction) less than the first length ($L_3$) of the interposer substrate (108) (block 408 in FIG. 4).

Figure 5B:
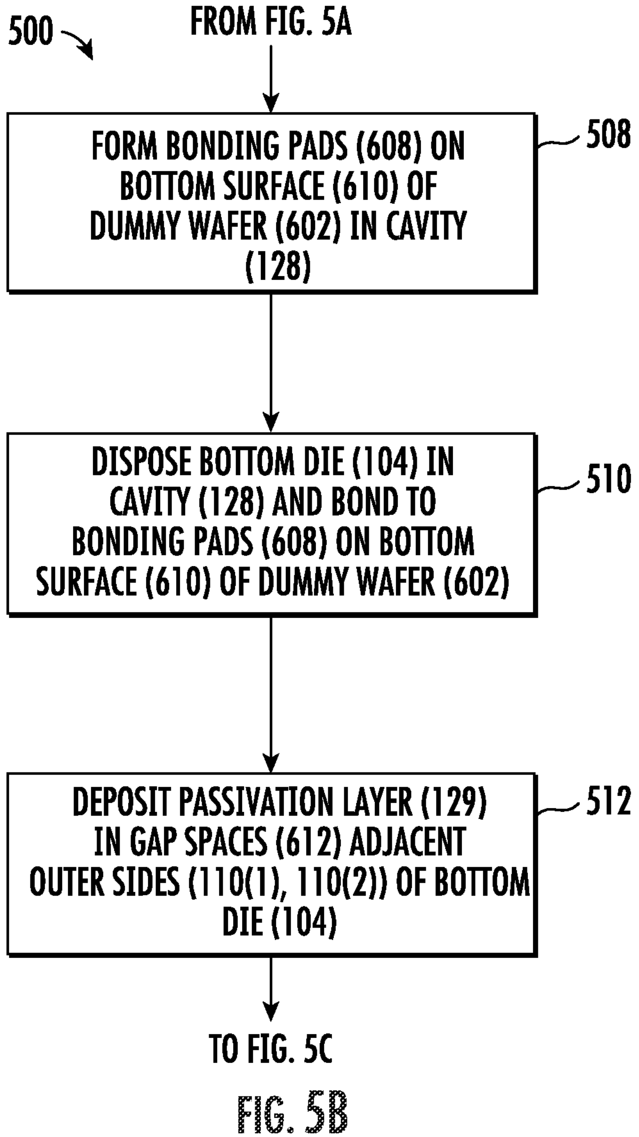
Figure 5C:
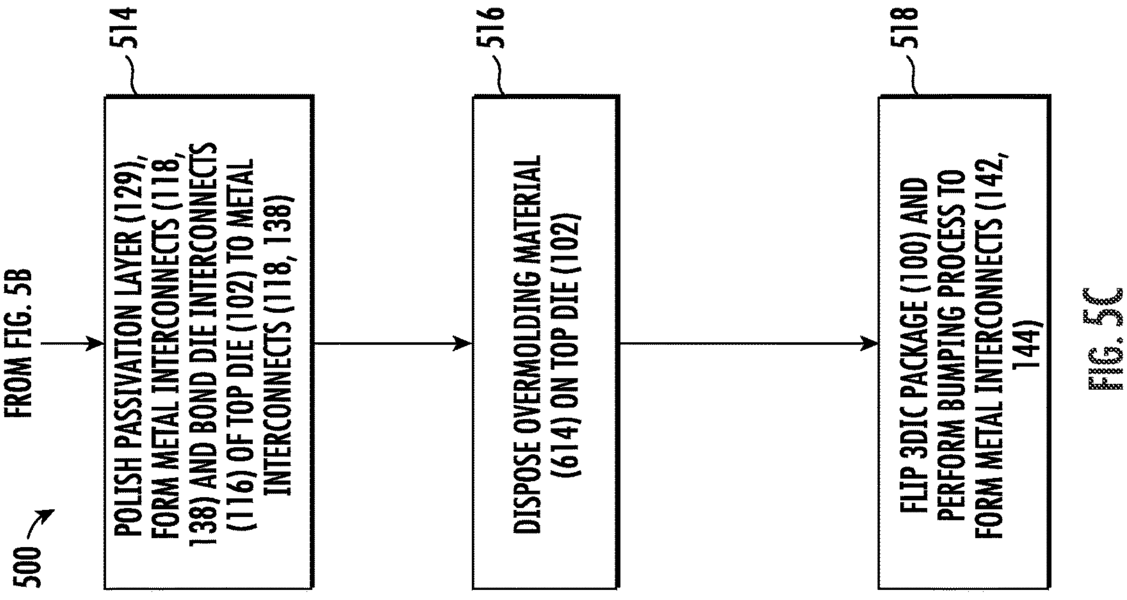

A 3DIC package in a TGB configuration that has a bottom die layer that includes an extended interposer substrate supporting a bottom die to provide additional die area in the bottom die layer in which a larger length, top die can be bonded, including the 3DIC package 100 in FIGS. 1A-2, can be fabricated in other fabrication processes. For example, FIGS. 5A-5C is a flowchart illustrating an exemplary fabrication process 500 of fabricating a TGB 3DIC package that has a bottom die layer that includes an extended interposer substrate supporting a bottom die(s) to provide additional die area in the bottom die layer in which a larger length, top die can be bonded. FIGS. 6A-6I illustrate exemplary fabrication stages 600A-600I according to the exemplary 3DIC fabrication process in FIGS. 5A-5C, The fabrication process 500 in FIGS. 5A-5C will be discussed in conjunction with the fabrication stages 600A-I in FIGS. 6A-6I and in reference to the 3DIC package 100 in FIGS. 1A-2 as an example.

In this regard, as illustrated in the exemplary fabrication stage 600A in FIG. 6A, a first step in the fabrication process 500 is to provide a dummy wafer 602 that will provide a structure in which to create the interposer substrate 108 (block 502 in FIG. 5A). Providing the dummy wafer 602 in which the interposer substrate 108 will be formed will provide additional die area for the bottom die layer 106 in the 3DIC package 100 in FIGS. 1A-2 in which the top die 102 can be bonded. As an example, the dummy wafer 602 may be a silicon wafer. Then, as illustrated in the exemplary fabrication stage 600B in FIG. 6B, a next step in the fabrication process 500 can be to etch out openings 604 and dispose a metal material 606 (e.g., copper) in the openings 604 to form the vias 120 (block 504 in FIG. 5A). As discussed above in regard to the 3DIC package 100 in FIG. 1A, the vias 120 are provided to provide signal routing paths through the interposer substrate 108 for the eventually bonded top die 102. The vias 120 can be TSVs that are formed in the interposer substrate 108 as a silicon substrate for example. In one example, to form the vias 120, after the openings 604 are formed in the dummy wafer 602, the metal material 606 is disposed on a top surface 607 of the dummy wafer 602 (e.g., by a metal plating process) to fill in the openings 604 with the metal material 606. A layer of the metal material 604 is formed on the top surface 607 of the dummy wafer 602. The metal material 604 disposed on the top surface 607 of the dummy wafer 602 is then polished or otherwise removed down to the openings 604 where the formed vias 120 are exposed from the top surface 607 of the dummy wafer 602.

Then, as illustrated in the exemplary fabrication stage 600C in FIG. 6C, a next step in the fabrication process 500 can be to etch out a portion of the dummy wafer 602 to form the cavity 128 in which the bottom die 104 will be disposed to form the bottom die layer 106 (block 506 in FIG. 5A). The dummy wafer 602 can be etched through a lithography process or with precision controlled etching direction into the dummy wafer 602 without need for a mask. The cavity 128 should be etched to be of an internal length $L_8$ that is sufficiently wide for the bottom die 104 to be able to be disposed in the cavity 128 and ideally with some tolerance to provide some space between side walls 607(1), 607(2) of the cavity 128. Note that the dummy wafer 602 may serve to provide a reconstituted wafer in which multiple cavities 128 are formed to each receive a bottom die 104 to eventually form multiple 3DIC packages in a TGB configuration.

Figure 6D:
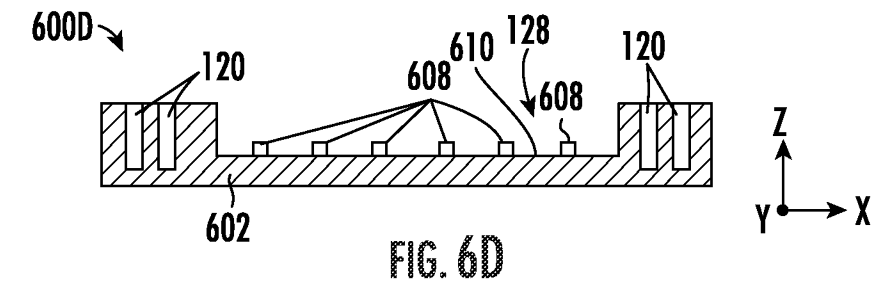
Figure 6E:
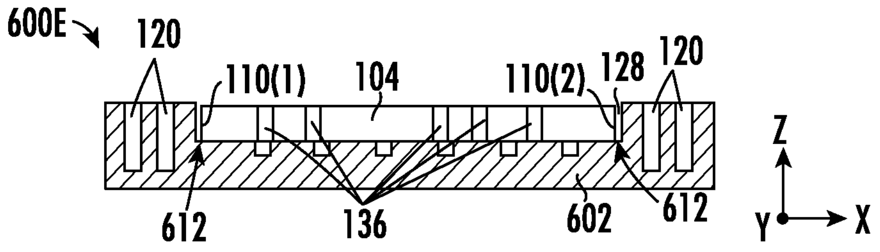
Figure 6F:
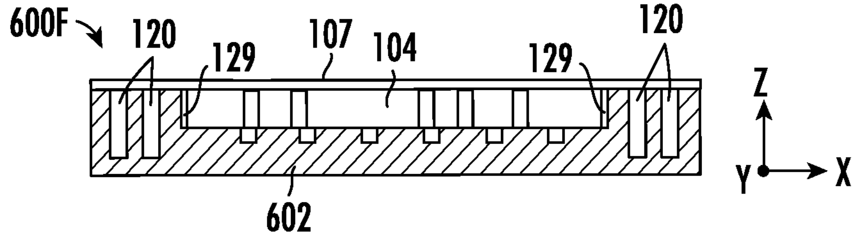

As illustrated in the exemplary fabrication stage 600D in FIG. 6D, a next step in the fabrication process 500 is to form bonding pads 608 in the cavity 128 (block 508 in FIG. SB). The bonding pads 608 will be used to bond the bottom die 104 when disposed in the cavity 128 and provide the metal interconnects 140. The bonding pads 608 are formed on a bottom surface 610 of the dummy wafer 602 inside the cavity 128 that was formed when the dummy wafer 602 was etched to provide the cavity 128. Alternatively, instead of providing the bonding pads 608 to bond the bottom die 104 to the cavity 128, the bottom die 104 may be bonded directly to the cavity 128, such as by a compression bonding or using an adhesive. As illustrated in the exemplary fabrication stage 600E in FIG. 6E, a next step in the fabrication process 500 is to dispose the bottom die 104 in the cavity 128 and bond the bottom die 104 to the bottom surface 610 of the cavity 128 by bonding the bottom die 104 to the bonding pads 608 (block 510 in FIG. 5B). Note that multiple bottom dies 104 may have been disposed in the dummy wafer 602 to form a reconstituted wafer, that will eventually form an interposer substrate 108 for multiple 3DIC packages in a TGB configuration. The through-vias 136 were formed in the bottom die 104 in a separate process. The bottom die 104 is fabricated in a separate process, examples of which are described below with regard to FIGS. 7A-10D, The cavity 128 is of sufficient length $L_8$ in this example that a gap space 612 is left between the outer sides 110(1), 110(2) of the bottom die 104 to provide a tolerance space. As illustrated in the exemplary fabrication stage 600F in FIG. 6F, a next step in the fabrication process 500 is to deposit the passivation layer 129 in the gap spaces 612 in the cavity 128 to insulate and isolate the bottom die 104 from the dummy wafer 602 and to also secure the bottom die 104 in the cavity 128 (block 512 in FIG. 5B).

Figure 6G:
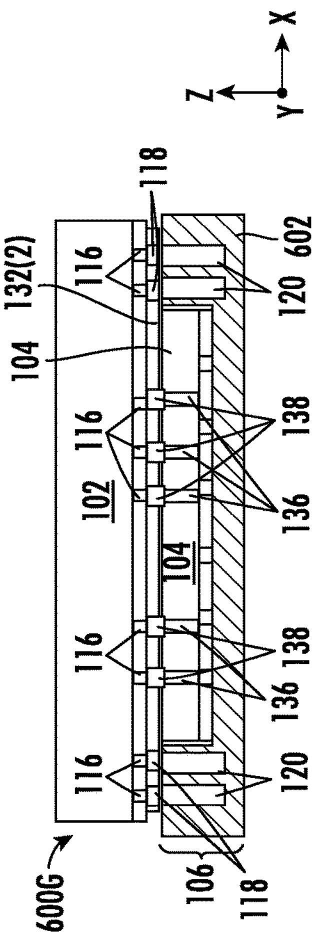
Figure 6H:
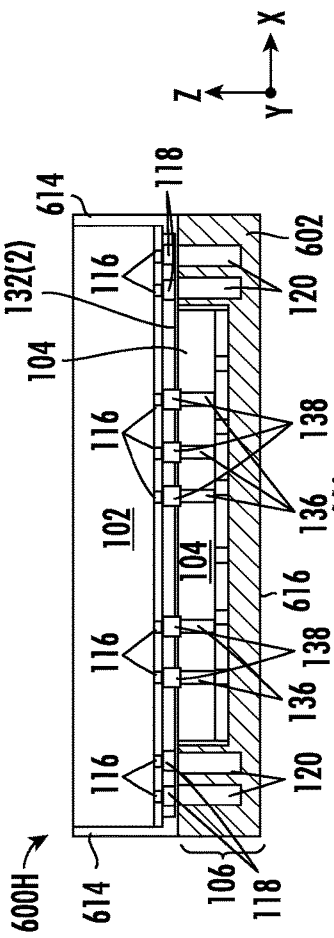

As illustrated in the exemplary fabrication stage 600G in FIG. 6G, a next step in the fabrication process 500 is to polish the passivation layer 129 down to the first surface 114 of the dummy wafer 602 as the interposer substrate 108 to then form the metal interconnects 118 coupled to the vias 120, and form the metal interconnects 138 coupled to the through-vias 136 adjacent to the inactive face 132(2) of the bottom die 104 (block 514 in FIG. 5C). Then, as also shown in FIG. 6G, the top die 102, and its die interconnects 116, are bonded to couple the die interconnects 116 to the metal interconnects 118, 138 (block 514 in FIG. 5C), Note that multiple top dies 102 may be coupled to respective bottom die layer 106 and its interposer substrate 108 as part of a reconstituted wafer to form multiple of the 3DIC packages 100. Then, as illustrated in the exemplary fabrication stage 600H in FIG. 61I, a next step in the fabrication process 500 is to dispose an overmolding material 614 on the dummy wafer 602 and the top die 102 mold to form the overmolding material 614 around the top die 102 (block 516 in FIG. 5C).

Figure 6I:
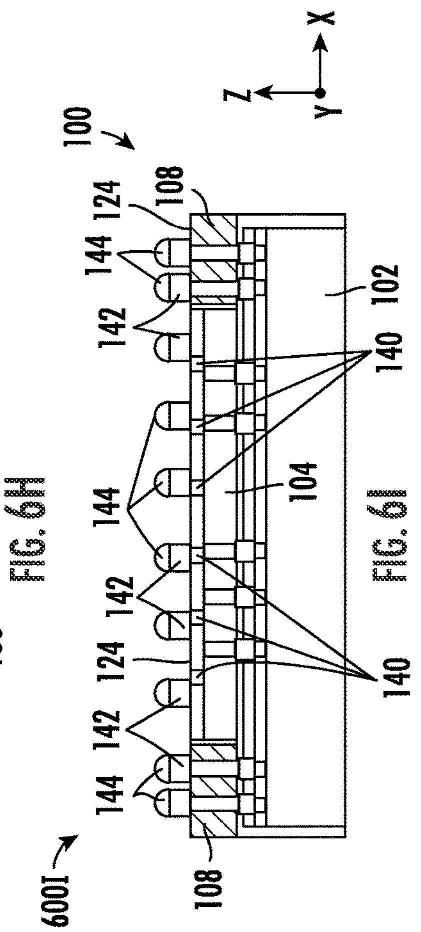

Then, as illustrated in the exemplary fabrication stage 600I in FIG. 6I, a next step in the fabrication process 500 is to flip the 3DIC package 100 to perform a bumping process to form the metal interconnects 142 in contact with the bonding pads 608 as metal interconnects 140. The metal interconnects 140 are exposed from the second surface 124 of the dummy wafer 602 to be coupled to the through-vias 136 of the bottom die 104 and the vias 120 to provide signal routing paths between the top die 102, through the bottom die 104. The metal interconnects 144 (e.g., solder bumps) are also formed through the bumping process (block 518 in FIG. 5C). In this example, as shown in FIG. 6I, before the 3DIC package 100 is flipped and the bumping process performed, a bottom surface 616 of the dummy wafer 602 (see FIG. 6H) is polished or otherwise processed to remove a portion of the dummy wafer 602 down to the bonding pads 608 to expose the vias 120 and the bonding pads 608 for the bottom die 104 to then perform the bumping process. The remaining portion of the dummy wafer 602 that remains after polishing forms the interposer substrate 108. Also, if multiple TGB 3DIC stacks of the top die 102 coupled to the bottom die 104 in the interposer substrate 108 are formed with the interposer substrate 108 as a reconstituted wafer, these multiple TGB stacks can be diced into separate the multiple 3DIC packages 100.

As discussed above in the fabrication process 500 in FIGS. 5A-5C, the bottom die 104 that was disposed in the cavity 128 of the dummy wafer 602 as the interposer substrate 108 was fabricated in a separate process. In this regard, FIG. 7 is a flowchart illustrating an exemplary bottom die fabrication process 700 for fabricating the bottom die 104 to be disposed in and bonded to an interposer substrate 108 of a 3DIC package in a TGB configuration, including the 3DIC package 100 in FIGS. 1A-2. FIGS. 8A-8C illustrate exemplary fabrication stages 800A-800C according to the exemplary bottom die fabrication process 700 in FIG. 7. In the fabrication process 700 in FIG. 7, the bottom die 104 is fabricated such that its bottom, active face 132(1) will be bonded to the interposer substrate 108. In this manner, the bottom, active face 132(1) of the bottom die 104 is not disposed adjacent to the top die 102 like shown in FIGS. 1A-2 in an inactive face-to-active face configuration between the bottom and top dies 104, 102.

In this regard, as illustrated in the exemplary fabrication stage 800A in FIG. 8A, a first step of the fabrication process 700 is to form bottom dies 104 in a wafer 802 and perform a bumping process on the active face 132(1) of the bottom die 104 to form the metal interconnects 140 (block 702 in FIG. 7). The bottom die 104 is processed as being part of a wafer 802. Then, as illustrated in the exemplary fabrication stage 800B in FIG. 8B, a next step of the fabrication process 700 is to thin down the back side 804 of the wafer 802 close or down to the through-vias 136 disposed in the bottom die 104 (block 704 in FIG. 7). The wafer 802 is then diced to form individual bottom dies 104 (block 706 in FIG. 7).

Figure 9A:
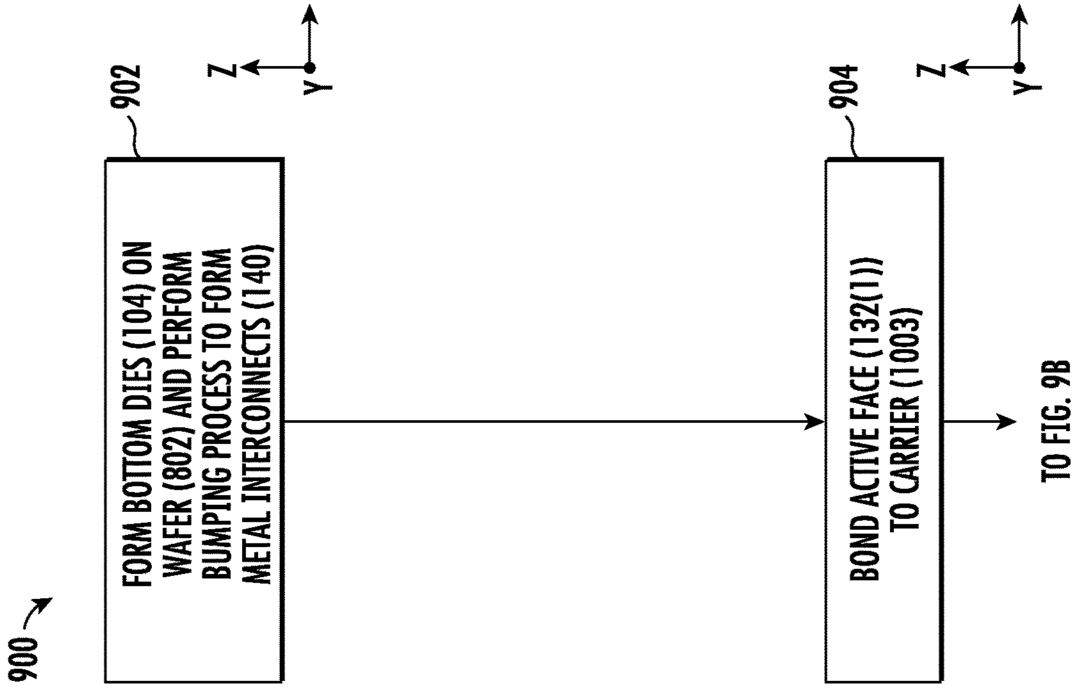
FIGS. 9A and 9B is a flowchart illustrating another exemplary bottom die fabrication process for fabricating bottom die to be disposed in and bonded to a bottom interposer substrate of a 3DIC package in a TGB configuration, with the top, inactive face of the bottom die bonded to the bottom interposer substrate.
Figure 10A:
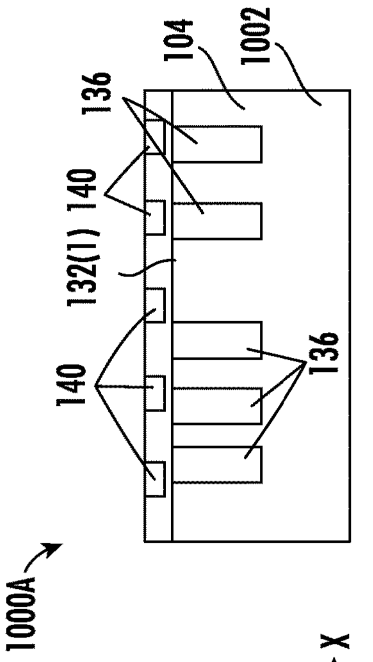
FIGS. 10A-10D illustrate exemplary fabrication stages according to the exemplary bottom die fabrication process in FIGS. 9A and 9B.
Figure 10B:
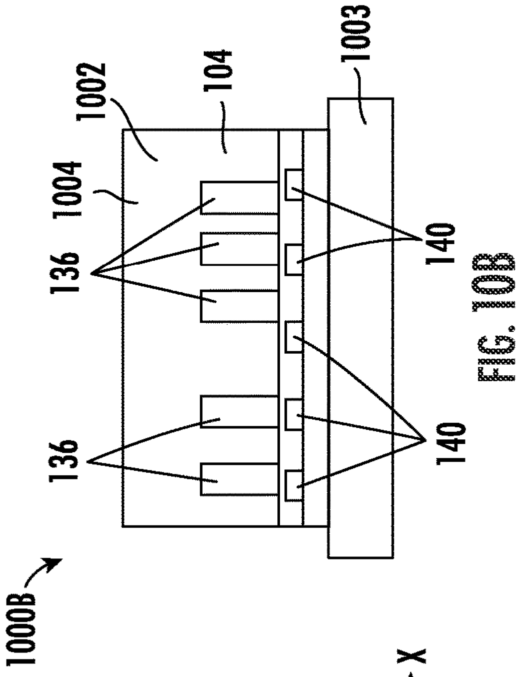
Figure 10C:
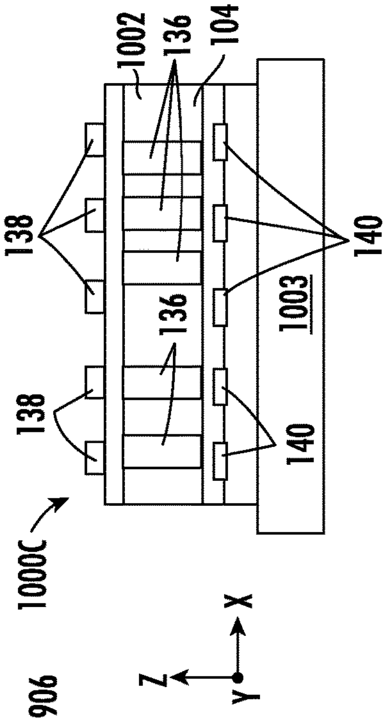
Figure 10D:
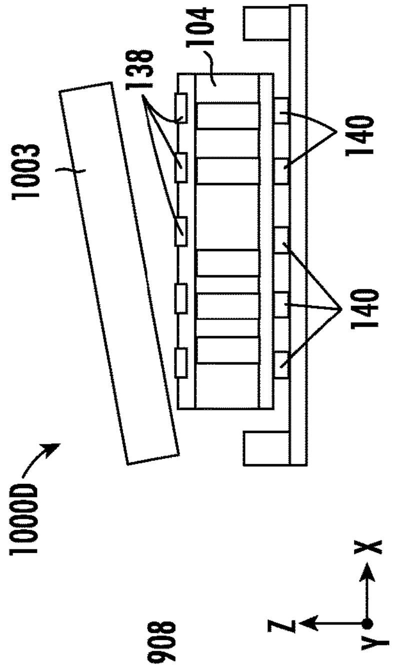
Figure 9B:
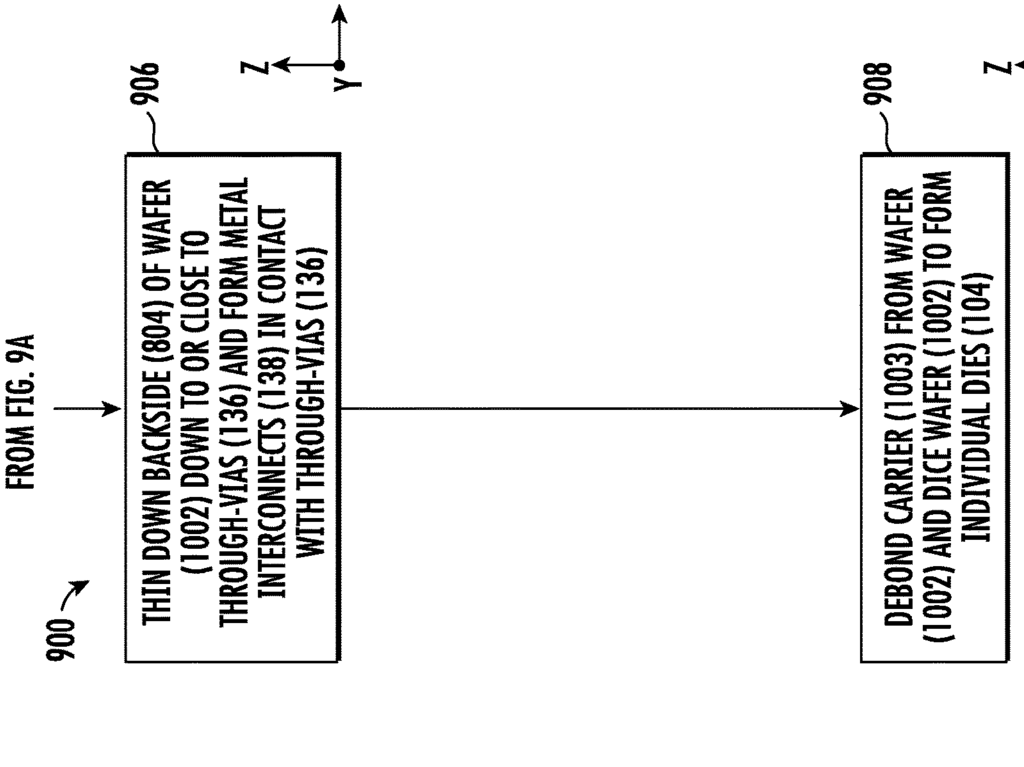

FIGS. 9A and 9B is a flowchart illustrating another exemplary bottom die fabrication process 900 for fabricating the bottom die 104 to be disposed in and bonded to an interposer substrate 108 of a 3DIC package in a TGB configuration, including the 3DIC package 100 in FIGS. 1A-2. FIGS. 10A-10D illustrate exemplary fabrication stages 1000A-1000D according to the exemplary bottom die fabrication process 700 in FIG. 7. In the fabrication process 900 in FIGS. 9A and 9B, the bottom die 104 is fabricated such that its top, inactive face 132(2) will be bonded to the interposer substrate 108 such that its bottom, active face 132(1) is disposed adjacent to the top die 102 in an active face-to-active face configuration between the bottom and top dies 104, 102.

In this regard, as illustrated in the exemplary fabrication stage 1000A in FIG. 1000A, a first step of the fabrication process 700 is to form bottom dies 104 in a wafer 1002 and perform a bumping process on the active face 132(1) of the bottom die 104 to form the metal interconnects 140 (block 902 in FIG. 9A). The bottom die 104 is processed as being part of a wafer 1002. Then, as illustrated in the exemplary fabrication stage 1000B in FIG. 10B, a next step of the fabrication process 900 is to bond the active face 132(1) of the bottom die 104 to a carrier 1003 so that the wafer 1002 can be further processed (block 904 in FIG. 9A). Then, as illustrated in the exemplary fabrication stage 1000C in FIG. 10C, a next step of the fabrication process 900 is to thin down a back side 1004 of the wafer 802 close or down to the through-vias 136 disposed in the bottom die 104 and to perform a bumping process to form the metal interconnects 138 coupled to the through-vias 136 (block 906 in FIG. 9B). Then, as illustrated in the exemplary fabrication stage 1000D in FIG. 10D, the carrier 1003 is de-bonded from the wafer 1002 and the wafer 1002 is then diced to form individual bottom dies 104 (block 908 in FIG. 9B).

As discussed above, the 3DIC package 100 in FIGS. 1A-2 includes a single bottom die 104 in the bottom die layer 106. Signals paths to the top die 102 are provided through vias 120 disposed through the interposer substrate extension portions 112(1), 112(2) as well as through the bottom die 104 itself through through-vias 136 disposed therein. It may be desired to include an additional bottom die in an interposer substrate of a 3DIC package to provide more consistency in the structure of the bottom die layer. This may help to avoid warpage. However, providing an additional bottom die in the interposer substrate may reduce the area of the interposer substrate extension portions in which vias can be provided (e.g., as TSVs) to provide additional signal routing paths to the top die 102.

Figure 11A:
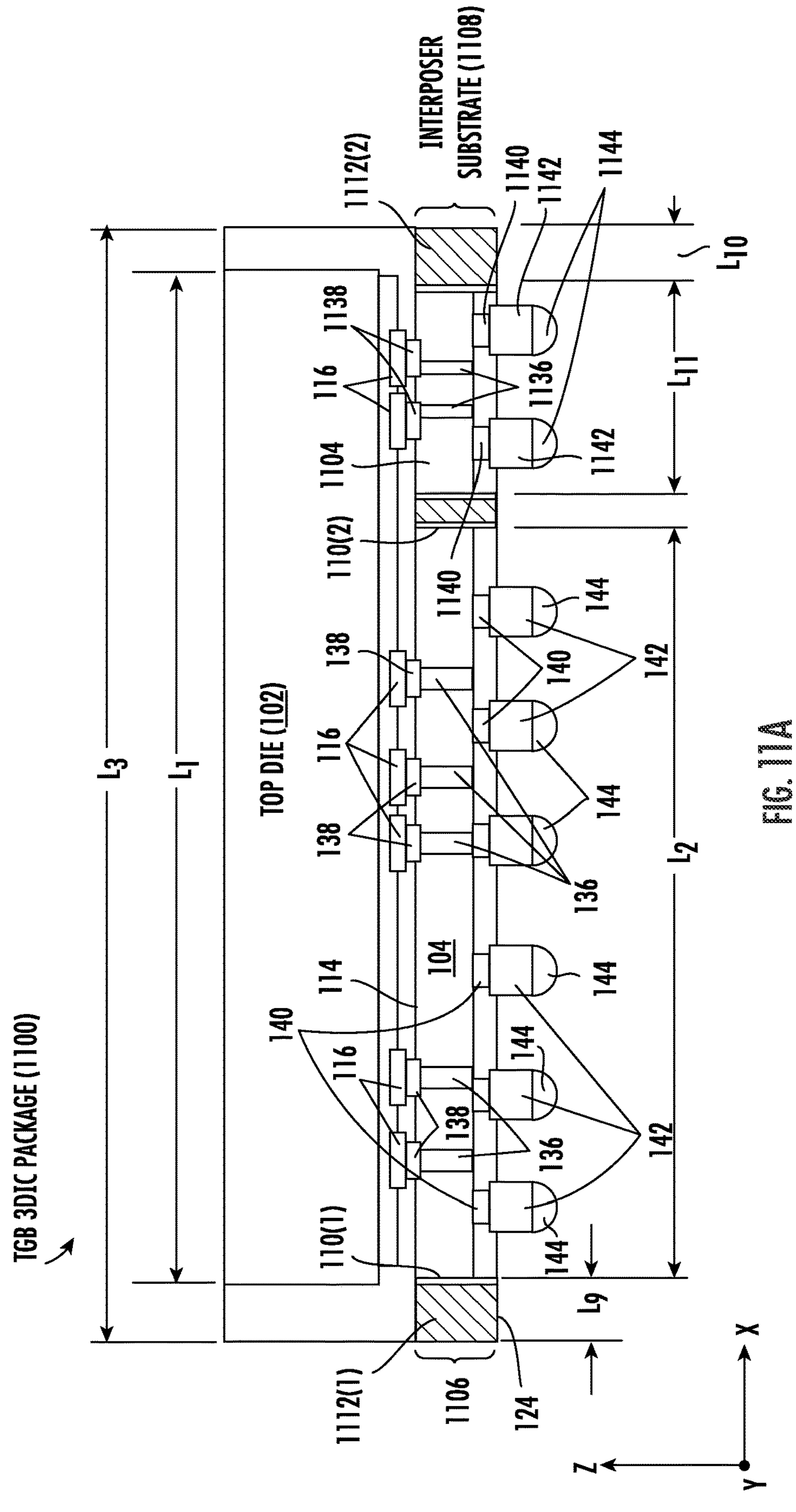
FIGS. 11A and 11B are side views of another exemplary 3DIC package in a TGB configuration that has a bottom die layer that includes an extended interposer substrate supporting a bottom die(s) to provide additional die area in the bottom die layer in which a larger length, top die can be bonded, and that can be fabricated in top die-to-bottom wafer bonding process, wherein the bottom die layer also includes an interposer die to provide an interposer between the first, bottom die layer and the second, top die.
Figure 11B:
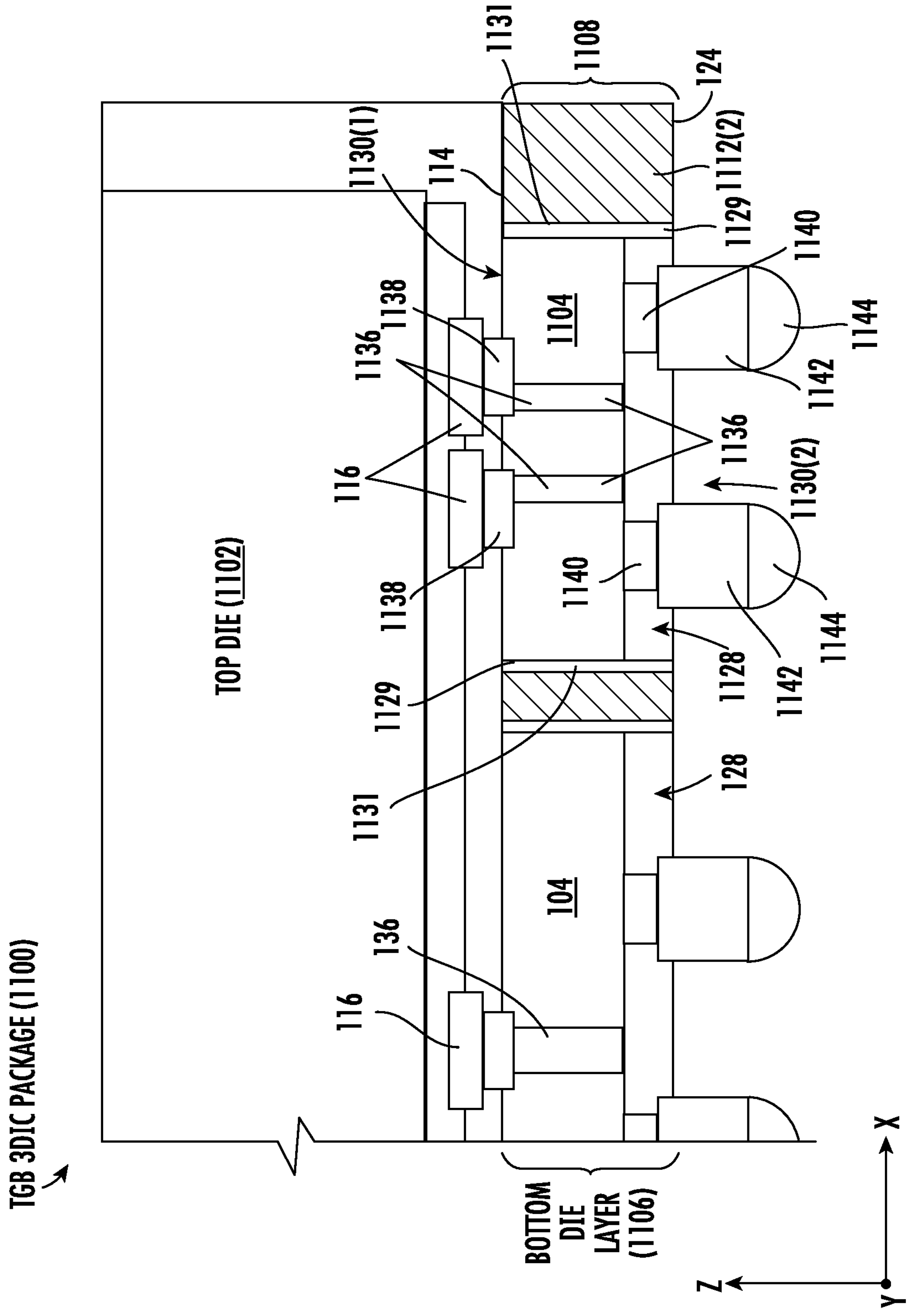

In this regard, FIGS. 11A and 11B are side views of another exemplary 3DIC package 1100 (also referred to as "3DIC package 1100") in a TGB configuration that has a bottom die layer 1106 that also includes an extended interposer substrate 1108 supporting a bottom die 104 to provide additional die area in the bottom die layer 106 in which a larger length, top die 102 can be bonded. However, as shown in FIG. 11A, an additional interposer die 1104 is disposed in the interposer substrate 1108 adjacent to the bottom die 104 in the first, horizontal direction (X-axis direction). As discussed in more detail below, through-vias 1136 (e.g., metal posts, metal pillars) are also disposed through the interposer die 1104 to provide additional signal path routings to the top die 102 in addition to the signal routing paths provided by the through-vias 136 in the bottom die 104 as discussed above. Common elements between the 3DIC package 100 in FIGS. 1A-2 and the 3DIC package 1100 in FIGS. 11A and 11B are shown with common element numbers, and the description of such elements above are also applicable to the 3DIC package 1100 in FIGS. 11A and 11B.

In this regard, with reference to FIG. 11A, the top die 102 is a second die that is stacked on and coupled to the bottom die layer 1106 in the second, vertical direction (Z-axis direction) to provide the 3DIC package 1100 as a three-dimensional stacked die package in the second, vertical direction (Z-axis direction), The bottom die layer 1106 that the bottom die 104 is disposed in includes a bottom interposer substrate 1108 (also referred to as "interposer substrate 1108"). The interposer substrate 1108 may have been fabricated from a dummy wafer as an example. The interposer substrate 1108 may be a semiconductor material that is formed as wafer during a fabrication process. For example, the interposer substrate 1108 may be made from silicon to provide a silicon interposer substrate 1108 as an example. The interposer substrate 1108 provides support for the bottom die 104, which is less in length $L_2$ than the length $L_3$ of the interposer substrate 1108, as part of the bottom die layer 1106 of the 3DIC package 1100. The interposer substrate 1108 is has a length $L_3$ that is extended from the outer sides 110(1), 110(2) of the bottom die 104 in a first, horizontal direction(s) (X-axis and/or Y-axis direction(s)). The interposer die 1104 has interposer substrate extension portions 1112(1), 1112(2) that extend from respective outer sides 110(1), 110(2) of the bottom die 104 in the first, horizontal direction (Z-axis direction) in this example by respective lengths $L_9$, $L_{10}$. The length $L_1$ of the top die 102 is less than length $L_3$ of the interposer substrate 108. In this manner, the interposer substrate 1108 of the bottom die layer 106 provides additional die area in the bottom die layer 1106 provides a wafer in which the larger length $L_1$ top die 102 can be bonded in a top die-to-bottom wafer fabrication process conventionally used for an 3DIC package having a BGT die configuration. In this manner, the bottom die layer 1106 in the 3DIC package 1100, with its extended interposer substrate 108, can be formed in a bottom wafer in which the top die 102 can be bonded in a top die-to-bottom wafer fabrication process to fabricate the 3DIC package 1100. A top die-to-bottom wafer fabrication process may involve less process steps and less complexity than a bottom die-to-top wafer fabrication process that is conventionally used to fabricate a 3DIC package in a TGB configuration.

With continuing reference to FIG. 11A, in this example, an interposer die 1104 is also disposed in the interposer substrate 1108. The interposer die 1104 is adjacent to the interposer substrate extension portion 1112(2) and between the bottom die 104 and the interposer substrate extension portion 1112(2) in the first, horizontal direction (X-axis direction). Providing the interposer die 1104 in the interposer substrate 1108 may provide additional stability in the interposer substrate 1108 and bottom die layer 1106 of the 3DIC package 1100. The interposer die 1104 has a length $L_{11}$ such that the combined lengths $L_2$, $L_{11}$ of the bottom die 104 and the interposer die 1104 are still less than the length $L_1$ of the top die 102. Thus, the interposer substrate 1108 still includes the interposer substrate extension portions 1112(1), 1112(2) to provide additional die area in the bottom die layer 1106 on which the top die 102 can be bonded.

With continuing reference to FIG. 11A, the interposer substrate 1108 of the bottom die layer 1106 has the first surface 114 that is adjacent to the top die 102. Die interconnects 116 of the top die 102 are coupled to metal interconnects 138 (e.g., solder bumps, ball-grid-array (BGA) interconnects) that are exposed from first surface 114 of the interposer substrate 108 and coupled to the through-vias 136. This provides signal routing paths between the top die 102 and the interposer substrate 108 through the bottom die 104. Also, die interconnects 116 of the top die 102 are coupled to metal interconnects 1138 (e.g., solder bumps, ball-grid-array (BGA) interconnects) that are also exposed from first surface 114 of the interposer substrate 108 and coupled to the through-vias 1136 in the interposer die 1104. This provides signal routing paths between the top die 102 and the interposer substrate 108 through the interposer die 1104, For example, the through-vias 1136 could be TSVs that are formed in the interposer die 1104. The through-vias 1136 are also coupled to metal interconnects 1140 (e.g., metal posts, metal pillars, ball-grid-array (BGA) interconnects) that are exposed from second surface 124 (on the opposite side of the first surface 114 in the second, vertical direction (Z-axis direction)) of the interposer substrate 1108 to be coupled to another structure, such as a package substrate or printed circuit board (PCB). Metal interconnects 1142 (e.g., metal pillars, metal posts) are formed on the metal interconnects 1140 through a bumping process. Metal interconnects 1144 (e.g., solder humps) are formed on the metal interconnects 1142. In this manner, the interposer die 1104 provides additional signal paths to the top die 102.

FIG. 11B is a close-up side view of the 3DIC package 1100 in FIG. 11A to illustrate additional detail. With reference to FIG. 11B, in this example, as discussed with regard to the 3DIC package 100 in FIGS. 1A-2, the bottom die 104 is disposed in the cavity 128 in the interposer substrate 108. The interposer die 1104 is also disposed in its own second cavity 1128 in the interposer substrate 108. The cavity 1128 may have been formed in the interposer substrate 1108 during fabrication of the 3DIC package 1100 as part of preparing the bottom die layer 106 in a wafer. A passivation layer 1129 (e.g., a dielectric material layer) is disposed on inner walls 1131 of the interposer substrate 108 to isolate the interposer die 1104 from the interposer substrate 1108. The cavity 1128 extends between and through the first and second surfaces 114, 124 of the interposer substrate 1108 in this example, such that the cavity 1128 has respective first and second openings 1130(1), 1130(2) adjacent to the first and second surfaces 114, 124 of the interposer substrate 1108.

With continuing reference to FIG. 11B, in this example, through-vias 1136 are disposed in a second, vertical direction (Z-axis direction) through the interposer die 1104 to provide additional signal paths to the top die 102. For example, the through-vias 1136 could be TSVs. In this regard, as shown in FIG. 11B, certain die interconnects 116 of the top die 102 that are aligned with the interposer die 1104 in the second, vertical direction (Z-axis direction) are coupled to metal interconnects 1138 (e.g., solder bumps, BGA interconnects) exposed from the first surface 114 of the interposer substrate 1108, The metal interconnects 1138 are coupled to the respective through-vias 1136. Metal interconnects 1140 (e.g., solder bumps, BGA interconnects) exposed from the second surface 124 of the interposer substrate 1018 are coupled to the respective through-vias 1136 to provide signal routing paths between the top die 102, through the interposer die 1104, and to the metal interconnects 1140 exposed from the second surface 124 of the interposer substrate 1108. The metal interconnects 1140 are coupled to other metal interconnects 1142 (e.g., metal posts, metal pillars, BGA interconnects) that may have metal interconnects 1144 (e.g., solder bumps) formed thereon to be able to be coupled to another structure, such as a package substrate or PCB.

Figure 12B:
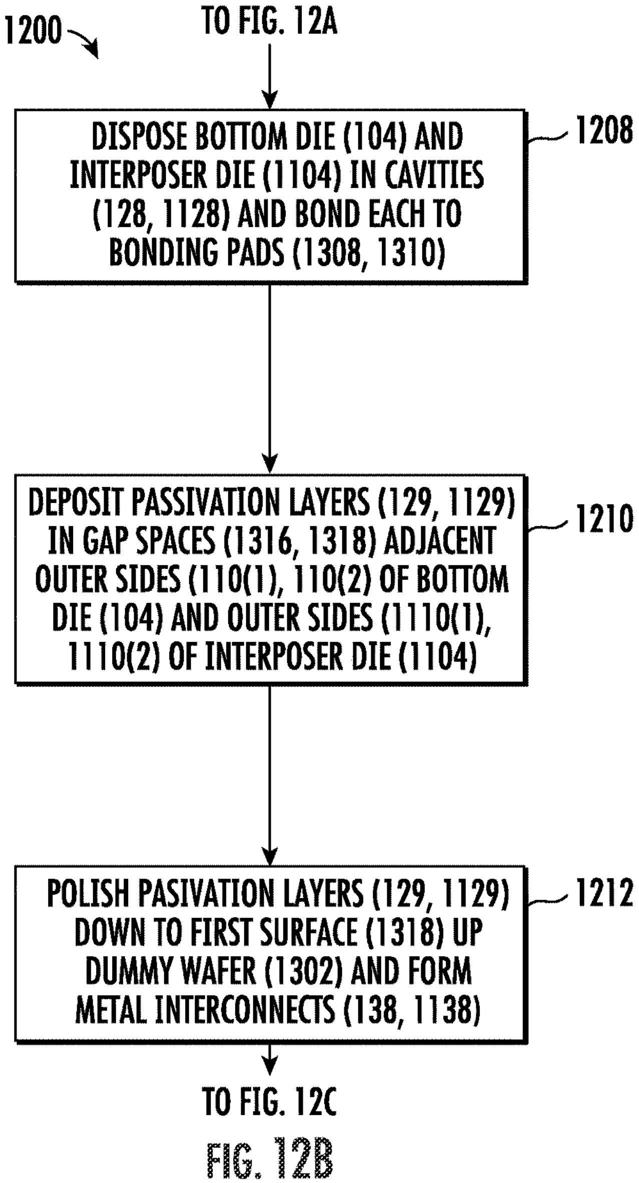

FIGS. 12A-12C is a flowchart illustrating an exemplary fabrication process 1200 of fabricating a 3DIC package in a TGB configuration that has a bottom die layer that includes an extended interposer substrate supporting a bottom die(s) to provide additional die area in the bottom die layer in which a larger length, top die can be bonded, and that also includes an interposer die disposed in the interposer substrate like the 3DIC package 1100 in FIGS. 11A and 11B. FIGS. 13A-13I illustrate exemplary fabrication stages 1300A-1300I according to the exemplary 3DIC fabrication process in FIGS. 12A-12C. The fabrication process 1200 in FIGS. 12A-12C will be discussed in conjunction with the fabrication stages 1300A-1300I in FIGS. 13A-13I and in reference to the 3DIC package 1100 in FIGS. 11A and 11B as an example.

In this regard, as illustrated in the exemplary fabrication stage 1300A in FIG. 13A, a first step in the fabrication process 1200 is to provide a dummy wafer 1302 that will provide a structure in which to create the interposer substrate 1108 (block 1202 in FIG. 12A), Providing the dummy wafer 1302 in which the interposer substrate 1108 will be formed will provide additional die area for the bottom die layer 1106 in the 3DIC package 1100 in FIGS. 11A and 11B in which the top die 102 can be bonded. As an example, the dummy wafer 1302 may be a silicon wafer. Then, as illustrated in the exemplary fabrication stage 1300B in FIG. 13B, a next step in the fabrication process 1200 can be to etch out portions of the dummy wafer 1302 to form the cavities 128, 1128 in which the bottom die 104 and the interposer die 1104 will be disposed, respectively, to form the bottom die layer 1106 (block 1204 in FIG. 12A). The dummy wafer 1302 can be etched through a lithography process or with precision controlled etching direction into the dummy wafer 1302 without need for a mask. The cavity 128 should be etched to be of an internal length $L_{12}$ that is sufficiently wide for the bottom die 104 to be able to be disposed in the cavity 128 and ideally with some tolerance to provide some space between side walls 1307(1), 1307(2) of the cavity 128. Similarly, the cavity 1128 should be etched to be of an internal length $L_{13}$ that is sufficiently wide for the interposer die 1104 to be able to be disposed in the cavity 1128 and ideally with some tolerance to provide some space between side walls 1309(1), 1309(2) of the cavity 1128. Note that the dummy wafer 1302 may serve to provide a reconstituted wafer in which multiple cavities 128, 1128 are formed to each receive a bottom die 104 to eventually form multiple 3DIC packages in a TGB configuration.

Figure 13D:
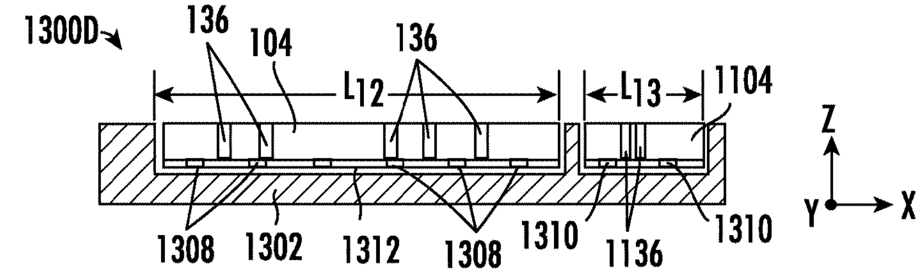
Figure 13E:
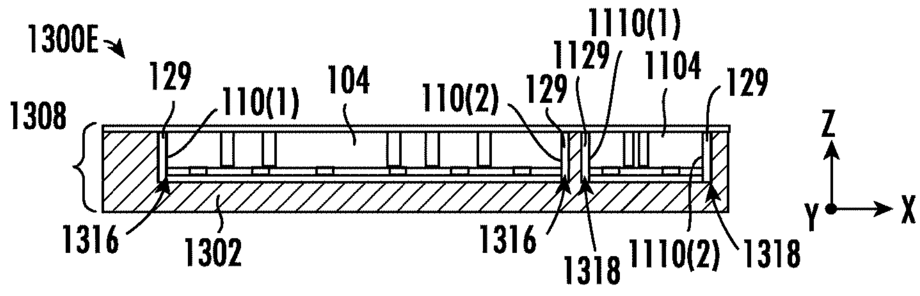
Figure 13F:
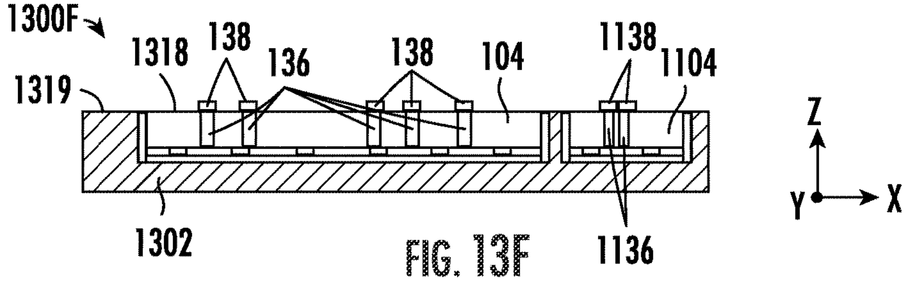

Then, as illustrated in the exemplary fabrication stage 1300C in FIG. 13D, a next step in the fabrication process 1200 is to form bonding pads 1308, 1310 in the respective cavities 128, 1128 (block 1206 in FIG. 12A), The bonding pads 1308, 1310 will be used to bond the bottom die 104 and interposer die 1104 when disposed in their respective cavities 128, 1128 and provide the respective metal interconnects 140, 1140. The bonding pads 1308, 1310 are formed on respective bottom surfaces 1312, 1314 of the dummy wafer 1302 inside the respective cavities 128, 1128 that was formed when the dummy wafer 1302 was etched to provide the cavities 128, 1128. Alternatively, instead of providing the bonding pads 1308, 1310 to bond the bottom die 104 and interposer die 1104 to the cavities 128, 1128, the bottom die 104 and interposer die 1104 may be bonded directly to the respective cavities 128, 1128, such as by a compression bonding or using an adhesive. Note that multiple bottom dies 104 and interposer dies 1104 may have been disposed in the dummy wafer 1302 to form a reconstituted wafer, that will eventually form an interposer substrate 1108 for multiple 3DIC packages in a TCB configuration.

As illustrated in the exemplary fabrication stage 1300D in FIG. 13D, a next step in the fabrication process 1200 is to dispose the bottom die 104 and interposer die 1104 in their respective cavities 128, 1128 and bond the bottom die 104 and interposer die 1104 to the bottom surfaces 1312, 1314 of the cavities 128, 1128 by bonding the bottom die 104 and interposer die 1104 to the respective bonding pads 1308, 1310 (block 1208 in FIG. 12B), The through-vias 136, 1136 in the respective bottom die 104 and interposer die 1104 were formed in the bottom die 104 and interposer die 1104 in a separate process. The bottom die 104 is fabricated in a separate process, examples of which are described herein with regard to FIGS. 7A-10D. The cavities 128, 1128 are of sufficient lengths $L_{12}$, $L_{13}$ in this example that a gap space 612 is left between the outer sides 110(1), 110(2) of the bottom die 104 to provide a tolerance space. As illustrated in the exemplary fabrication stage 1300E in FIG. 13E, a next step in the fabrication process 500 is to deposit the passivation layers 129, 1129 in the gap spaces 1316, 1318 in the respective cavities 128, 1128 adjacent to the respective outer sides 110(1), 110(2) of the bottom die 104 and outer sides 1110(1), 1110(2) of the interposer die 1104 (block 1210 in FIG. 6B). This is to insulate and isolate the bottom die 104 and interposer die 1104 from the dummy wafer 1302 and to also secure the bottom die 104 and interposer die 1104 in their respective cavities 128, 1128. Then, as illustrated in the exemplary fabrication stage 1300F in FIG. 13F, a next step in the fabrication process 1200 is to polish the passivation layers 129, 1129 down to a first surface 1319 of the dummy wafer 1302 to then form the metal interconnects 138 coupled to the through-vias 136 of the bottom die 104, and form the metal interconnects 1138 coupled to the through-vias 1136 of the interposer die 1104 (block 1212 in FIG. 12B).

Then, as also shown in FIG. 13G, the top die 102, and its die interconnects 116, are bonded to couple the die interconnects 116 to the metal interconnects 138, 1138 coupled to the bottom die 104 and interposer die 1104 (block 1214 in FIG. 6C). Note that multiple top dies 102 may be coupled to the respective bottom die layer 1106 and its interposer substrate 1108 as part of a reconstituted wafer to form multiple of the 3DIC packages 1100. Then, as illustrated in the exemplary fabrication stage 1200H in FIG. 13H, a next step in the fabrication process 1200 is to dispose an overmolding material 1320 on the dummy wafer 1302 and the top die 102 mold to form the overmolding material 1320 around the top die 102 (block 1216 in FIG. 6C). Then, as illustrated in the exemplary fabrication stage 1300I in FIG. 13I, a next step in the fabrication process 1200 is to flip the 3DIC package 1100 to perform a bumping process to form the metal interconnects 142, 1142 in contact with the bonding pads 1308, 1310 exposed from the second surface 124 of the dummy wafer 1302 as the metal interconnects 140, 1140. The metal interconnects 140, 1140 are coupled to the respective through-vias 136, 1136 of the bottom die 104 and interposer die 1104, to provide signal routing paths between the top die 102, through the bottom die 104 and interposer die 1104. The metal interconnects 144, 1144 (e.g., solder bumps) are also formed through the bumping process (block 1218 in FIG. 12C), Also in this example, as shown in FIG. 13I, before the 3DIC package 1100 is flipped and the bumping process performed, a bottom surface 1316 of the dummy wafer 1302 (see FIG. 13H) is polished or otherwise processed to remove a portion of the dummy wafer 1302 down to the bonding pads 1308, 1310 (see FIG. 13H) to expose the bonding pads 1308, 1310 and the vias 136, 1136 for the bottom die 104 and interposer die 1104 to then perform the bumping process. The remaining portion of the dummy wafer 1302 that remains after polishing forms the interposer substrate 1108. Also, if multiple TGB 3DIC stacks of the top die 102 coupled to the bottom die 104 and interposer die 1104 in the interposer substrate 1108 are formed with the interposer substrate 1108 as a reconstituted wafer, these multiple TGB stacks can be diced into separate the multiple 3DIC packages 1100.

An 3DIC package in a TGB configuration that has a bottom die layer that includes an extended interposer substrate supporting a bottom die(s) to provide additional die area in the bottom die layer in which a larger length, top die can be bonded, including, but not limited, to the 3DIC packages 100, 1100 in FIGS. 1A-2, 6A-6I, 11A-11B, and 13A-13I, and according to the exemplary fabrication processes in FIGS. 4, 5A-5C, and 12A-12C, and according to any aspects disclosed herein, may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 14:
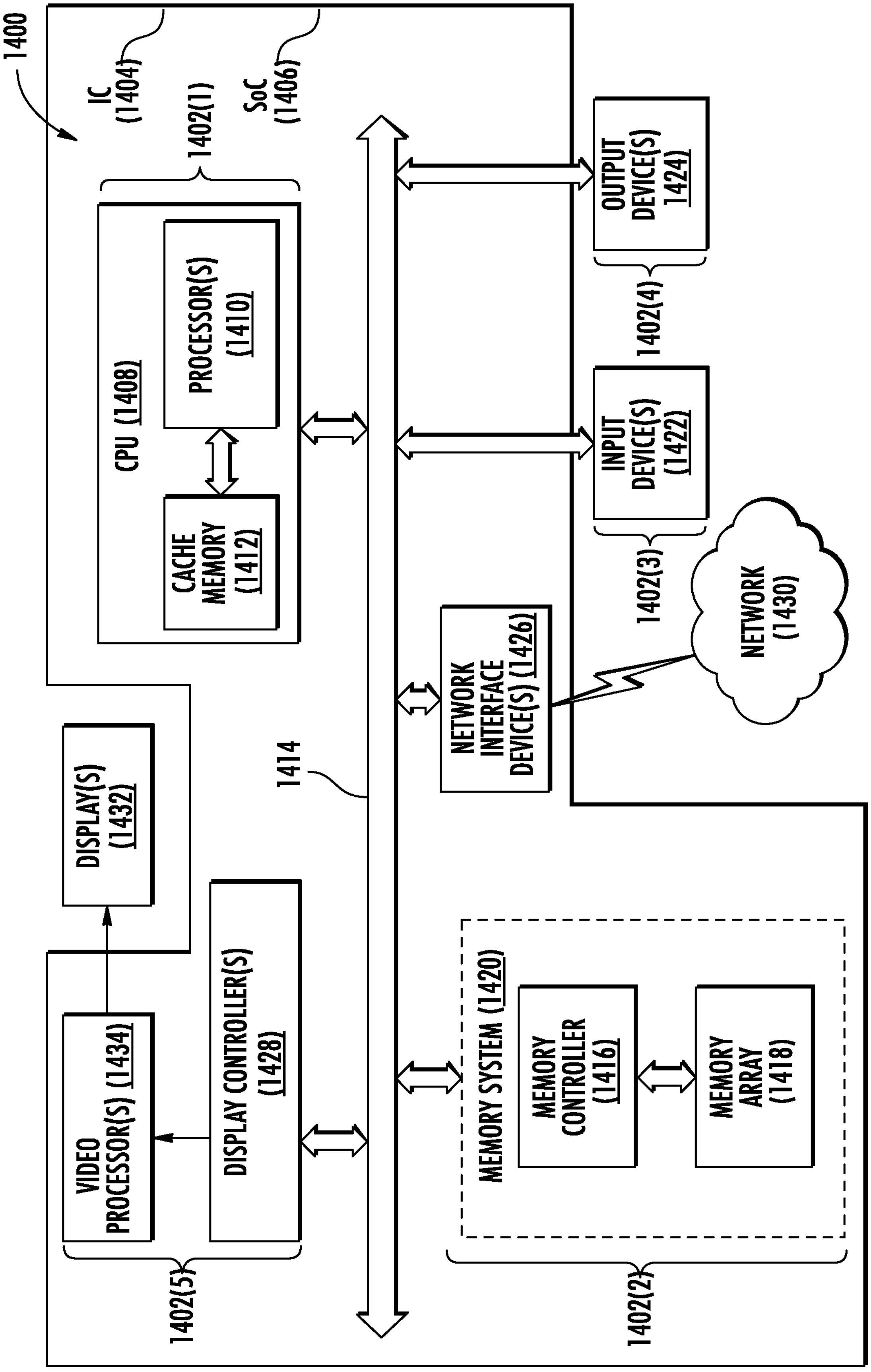
FIG. 14 is a block diagram of an exemplary processor-based system that can include components that can include a 3DIC package in a TGB configuration that has a bottom die layer that includes an extended interposer substrate supporting a bottom die(s) to provide additional die area in the bottom die layer in which a larger length, top die can be bonded, including, but not limited, to the 3DIC packages FIGS. 1A-2, 6A-6I, 11, 13A-13I, and according to the exemplary fabrication processes in FIGS. 4, 5A-5C, and 12A-12C.

In this regard, FIG. 14 illustrates an example of a processor-based system 1400. The components of the processor-based system 1400 are ICs 1402. Some or all of the ICs 1402 in the processor-based system 1400 can be provided as a 3DIC package that has a bottom die layer that includes an extended interposer substrate supporting a bottom die(s) to provide additional die area in the bottom die layer in which a larger length, top die can be bonded, including, but not limited, to the 3DIC packages 100, 1100 FIGS. 1A-2, 6A-6I, 11A-11B, 13A-13I, and according to the exemplary fabrication processes in FIGS. 4, 5A-5C, and 12A-12C, and according to any aspects disclosed herein. In this example, the processor-based system 1400 may be formed as IC package 1404 and as a system-on-a-chip (SoC) 1406. The processor-based system 1400 includes a CPU 1408 that includes one or more processors 1410, which may also be referred to as CPU cores or processor cores. The CPU 1408 may have cache memory 1412 coupled to the CPU 1408 for rapid access to temporarily stored data. The CPU 1408 is coupled to a system bus 1414 and can intercouple master and slave devices included in the processor-based system 1400. As is well known, the CPU 1408 communicates with these other devices by exchanging address, control, and data information over the system bus 1414. For example, the CPU 1408 can communicate bus transaction requests to a memory controller 1416 as an example of a slave device. Although not illustrated in FIG. 14, multiple system buses 1414 could be provided, wherein each system bus 1414 constitutes a different fabric.

Other master and slave devices can be connected to the system bus 1414. As illustrated in FIG. 14, these devices can include a memory system 1420 that includes the memory controller 1416 and a memory array(s) 1418, one or more input devices 1422, one or more output devices 1424, one or more network interface devices 1426, and one or more display controllers 1428, as examples. Each of the memory system 1420, the one or more input devices 1422, the one or more output devices 1424, the one or more network interface devices 1426, and the one or more display controllers 1428 can be provided in the same or different circuit packages. The input device(s) 1422 can include any type of input device, including, but not limited to, input keys, switches, voice processors, etc. The output device(s) 1424 can include any type of output device, including, but not limited to, audio, video, other visual indicators, etc. The network interface device(s) 1426 can be any device configured to allow exchange of data to and from a network 1430. The network 1430 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 1426 can be configured to support any type of communications protocol desired.

The CPU 1408 may also be configured to access the display controller(s) 1428 over the system bus 1414 to control information sent to one or more displays 1432. The display controller(s) 1428 sends information to the display(s) 1432 to be displayed via one or more video processors 1434, which process the information to be displayed into a format suitable for the display(s) 1432. The display controller(s) 1428 and video processor(s) 1434 can be included as IC package 1404 and the same or different circuit packages, and in the same or different circuit packages containing the CPU 1408 as an example. The display(s) 1432 can include any type of display, including, but not limited to, a cathode ray tube (CRT), a liquid crystal display (LCD), a plasma display, a light emitting diode (LED) display, etc.

Figure 15:
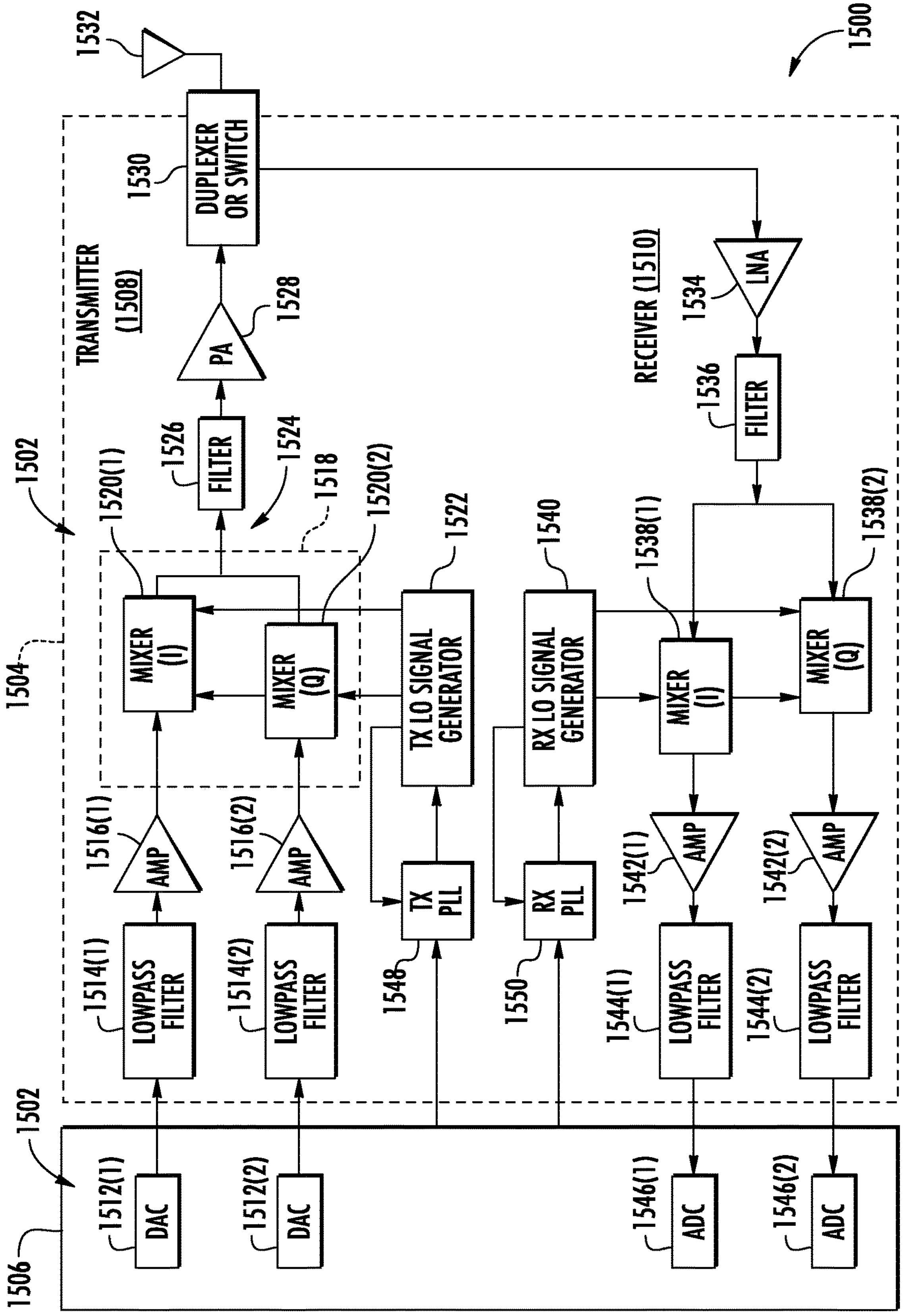
FIG. 15 is a block diagram of an exemplary wireless communications device that includes radio-frequency (RF) components that can include 3DIC package in a TGB configuration that has a bottom die layer that includes an extended interposer substrate supporting a bottom die(s) to provide additional die area in the bottom die layer in which a larger length, top die can be bonded, including, but not limited, to the 3DIC packages FIGS. 1A-2, 6A-6I, 11, 13A-13I, and according to the exemplary fabrication processes in FIGS. 4, 5A-5C, and 12A-12C.

FIG. 15 illustrates an exemplary wireless communications device 1500 that includes radio frequency (RF) components formed from one or more ICs 1502. Any of the ICs 1502 can include 3DIC package that has a bottom die layer that includes an extended interposer substrate supporting a bottom die(s) to provide additional die area in the bottom die layer in which a larger length, top die can be bonded, including, but not limited, to the 3DIC packages 100, 1100 in FIGS. 1A-2, 6A-6I, 11A-11B, 13A-13I, and according to the exemplary fabrication processes in FIGS. 4, 5A-5C, and 12A-12C, and according to any aspects disclosed herein. The wireless communications device 1500 may include or be provided in any of the above-referenced devices, as examples. As shown in FIG. 15, the wireless communications device 1500 includes a transceiver 1504 and a data processor 1506. The data processor 1506 may include a memory to store data and program codes. The transceiver 1504 includes a transmitter 1508 and a receiver 1510 that support bi-directional communications. In general, the wireless communications device 1500 may include any number of transmitters 1508 and/or receivers 1510 for any number of communication systems and frequency bands. All or a portion of the transceiver 1504 may be implemented on one or more analog ICs, RFICs, mixed-signal ICs, etc.

The transmitter 1508 or the receiver 1510 may be implemented with a super-heterodyne architecture or a direct-conversion architecture. In the super-heterodyne architecture, a signal is frequency-converted between RF and baseband in multiple stages, e.g., from RF to an intermediate frequency (IF) in one stage, and then from IF to baseband in another stage for the receiver 1510. In the direct-conversion architecture, a signal is frequency-converted between RF and baseband in one stage. The super-heterodyne and direct-conversion architectures may use different circuit blocks and/or have different requirements. In the wireless communications device 1500 in FIG. 15, the transmitter 1508 and the receiver 1510 are implemented with the direct-conversion architecture.

In the transmit path, the data processor 1506 processes data to be transmitted and provides I and Q analog output signals to the transmitter 1508. In the exemplary wireless communications device 1500, the data processor 1506 includes digital-to-analog converters (DACs) 1512(1), 1512(2) for converting digital signals generated by the data processor 1506 into the I and Q analog output signals, e.g., I and Q output currents, for further processing.

Within the transmitter 1508, lowpass filters 1514(1), 1514(2) filter the I and Q analog output signals, respectively, to remove undesired signals caused by the prior digital-to-analog conversion. Amplifiers (AMPs) 1516(1), 1516(2) amplify the signals from the lowpass filters 1514(1), 1514(2), respectively, and provide I and Q baseband signals. An upconverter 1518 upconverts the I and Q baseband signals with I and Q transmit (TX) local oscillator (LO) signals through mixers 1520(1), 1520(2) from a TX LO signal generator 1522 to provide an upconverted signal 1524. A filter 1526 filters the upconverted signal 1524 to remove undesired signals caused by the frequency upconversion as well as noise in a receive frequency band. A power amplifier (PA) 1528 amplifies the upconverted signal 1524 from the filter 1526 to obtain the desired output power level and provides a transmit RF signal. The transmit RF signal is routed through a duplexer or switch 1530 and transmitted by an antenna 1532.

In the receive path, the antenna 1532 receives signals transmitted by base stations and provides a received RF signal, which is routed through the duplexer or switch 1530 and provided to a low noise amplifier (LNA) 1534. The duplexer or switch 1530 is designed to operate with a specific receive (RX)-to-TX duplexer frequency separation, such that RX signals are isolated from TX signals. The received RF signal is amplified by the LNA 1534 and filtered by a filter 1536 to obtain a desired RF input signal. Down-conversion mixers 1538(1), 1538(2) mix the output of the filter 1536 with I and Q RX LO signals (i.e., LO_1 and LO_Q) from an RX LO signal generator 1540 to generate I and Q baseband signals. The I and Q baseband signals are amplified by AMPs 1542(1), 1542(2) and further filtered by lowpass filters 1544(1), 1544(2) to obtain I and Q analog input signals, which are provided to the data processor 1506. In this example, the data processor 1506 includes analog-to-digital converters (ADCs) 1546(1), 1546(2) for converting the analog input signals into digital signals to be further processed by the data processor 1506.

In the wireless communications device 1500 of FIG. 15, the TX LO signal generator 1522 generates the I and Q TX LO signals used for frequency upconversion, while the RX LO signal generator 1540 generates the I and Q RX LO signals used for frequency downconversion. Each LO signal is a periodic signal with a particular fundamental frequency. A TX phase-locked loop (PLL) circuit 1548 receives timing information from the data processor 1506 and generates a control signal used to adjust the frequency and/or phase of the TX LO signals from the TX LO signal generator 1522. Similarly, an RX PLL circuit 1550 receives timing information from the data processor 1506 and generates a control signal used to adjust the frequency and/or phase of the RX LO signals from the RX LO signal generator 1540.

Note that the terms "top" and "bottom" as used herein are relative terms. A component being referred to as a "top" component is disposed as shown in the figure in a second, vertical direction above another component referred to as a "bottom" component. However, such is not limiting. In a reverse orientation, a component referred to as a "top" component could be flow another component referred to as a "bottom" component.

Those of skill in the art will further appreciate that the various illustrative logical blocks, modules, circuits, and algorithms described in connection with the aspects disclosed herein may be implemented as electronic hardware, instructions stored in memory or in another computer-readable medium wherein any such instructions are executed by a processor or other processing device, or combinations of both. Memory disclosed herein may be any type and size of memory and may be configured to store any type of information desired. To clearly illustrate this interchangeability, various illustrative components, blocks, modules, circuits, and steps have been described above generally in terms of their functionality. Flow such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein, but is to be accorded the widest scope consistent with the principles and novel features disclosed herein.

Implementation examples are described in the following numbered clauses:

1. An integrated circuit (IC) package, comprising:
   a first die layer, comprising:
      an interposer substrate extending a first length in a first direction; and
      a first die disposed in the interposer substrate; and
   a second die coupled to the first die layer in a second direction orthogonal to the first direction;
   the second die extending a second length in the first direction less than the first length of the interposer substrate.
2. The IC package clause 1, wherein:
   the first die comprises a first active face and a first inactive face;
   the second die comprises a second active face and a second inactive face; and
   the first inactive face of the first die is adjacent to the second active face of the second die.
3. The IC package of clause 1, wherein:
   the first die comprises a first active face and a first inactive face;
   the second die comprises a second active face and a second inactive face; and
   the first active face of the first die is adjacent to the second active face of the second die.
4. The IC package of any of clauses 1 to 3, further comprising one or more vias disposed through the first die in the second direction, the one or more vias coupled to the second die.
5. The IC package of any of clauses 1 to 4, wherein:
   the interposer substrate comprises:
      a first surface adjacent to the second die;
      a second surface on an opposite side of the first surface in the second direction; and
      an interposer substrate extension portion adjacent to the first die in the first direction; and
   further comprising one or more metal interconnects disposed in the interposer substrate extension portion and extending from the first surface of the interposer substrate to the second surface of the interposer substrate in the second direction; and
   the second die coupled to at least one metal interconnect among the one or more metal interconnects.
6. The IC package of clause 5, wherein the second die comprises one or more second die interconnects; and
   at least one second die interconnect among the one or more second die interconnects coupled to the at least one metal interconnect among the one or more metal interconnects.
7. The IC package of clause 4, wherein the second die comprises one or more second die interconnects; and
   at least one second die interconnect among the one or more second die interconnects coupled to at least one via among the one or more vias.
8. The IC package of any of clauses 1 to 7, wherein the interposer substrate comprises silicon.
9. The IC package of any of clauses 1 to 8 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.
10. A method of fabricating an integrated circuit (IC) package, comprising:
   forming a first die layer, comprising:
      providing interposer substrate extending a first length in a first direction; and
      disposing a first die in the interposer substrate; and
   coupling a second die to the first die layer in a second direction orthogonal to the first direction, the second die extending a second length in the first direction less than the first length of the interposer substrate.
11. The method of clause 10, wherein coupling the second die to the first die layer comprises coupling a second active face of the second die to a first inactive face of the first die.
12. The method of clause 10, wherein coupling the second die to the first die layer comprises coupling a second active face of the second die to a first active face of the first die,
13. The method of any of clauses 10 to 12, further comprising forming one or more vias through the first die in the second direction;
   wherein coupling the second die to the first die layer further comprises coupling the second die to the one or more vias.
14. The method of any of clauses 10 to 13, wherein:
   providing the interposer substrate comprises providing a dummy wafer; and
   disposing the first die in the interposer substrate comprises:
      forming a cavity in the dummy wafer; and
      disposing the first die in the cavity.
15. The method of clause 14, further comprising depositing a passivation layer on inner walls of the cavity adjacent to outer walls of the first die.
16. The method of clause 15, wherein the first die comprises one or more through-vias, and
   further comprising polishing the passivation layer down to the one or more through-vias of the first die.
17. The method of any of clauses 10 to 16, Wherein the first die comprises one or more through-vias, and
   further comprising forming one or more metal interconnects in contact with a respective through-via of the one or more through-vias.

18. The method of clause 17, wherein coupling the second die to the first die layer further comprises coupling one or more die interconnects of the second die to the one or more metal interconnects.

19. The method of any of clauses 10 to 18, further comprising:

disposing one or more metal interconnects in an interposer substrate extension portion adjacent to the first die in the first direction, the one or more metal interconnects extending from a first surface of the interposer substrate adjacent to the second die to a second surface of the interposer substrate on an opposite side of the first surface of the interposer substrate;

wherein coupling the second die to the first die layer further comprises coupling the second die to at least one metal interconnect among the one or more metal interconnects.

20. The method of any of clauses 14 to 16, further comprising:

forming a second cavity in the interposer substrate;

disposing an interposer die in the second cavity in the interposer substrate; and forming one or more vias through the interposer die;

wherein coupling the second die to the first die layer further comprises coupling the second die to the one or more vias.

What is claimed is:

1. A method of fabricating an integrated circuit (IC) package, comprising:

forming a first die layer, comprising:

providing an interposer substrate comprising a semiconductor material, the interposer substrate extending a first length in a first direction, wherein:

providing the interposer substrate comprises:

providing a dummy wafer; and disposing the first die in the interposer substrate comprises:

forming a cavity in the dummy wafer; and disposing the first die in the cavity;

coupling a second die to the first die layer in a second direction orthogonal to the first direction, the second die extending a second length in the first direction less than the first length of the interposer substrate;

depositing a passivation layer on inner walls of the cavity adjacent to outer walls of the first die, wherein the first die comprises one or more through-vias; and polishing the passivation layer down to the one or more through-vias of the first die.

2. The method of claim 1, wherein coupling the second die to the first die layer comprises coupling a second active face of the second die to a first inactive face of the first die.

3. The method of claim 1, wherein coupling the second die to the first die layer comprises coupling a second active face of the second die to a first active face of the first die.

4. The method of claim 1, further comprising forming one or more vias through the first die in the second direction;

wherein coupling the second die to the first die layer further comprises coupling the second die to the one or more vias.

5. The method of claim 1, further comprising:

disposing one or more metal interconnects in an interposer substrate extension portion adjacent to the first die in the first direction, the one or more metal interconnects extending from a first surface of the interposer substrate adjacent to the second die to a second surface of the interposer substrate on an opposite side of the first surface of the interposer substrate;

wherein coupling the second die to the first die layer further comprises coupling the second die to at least one metal interconnect among the one or more metal interconnects.

6. The method of claim 1, further comprising forming one or more metal interconnects in contact with a respective through-via of the one or more through-vias.

7. The method of claim 6, wherein coupling the second die to the first die layer further comprises coupling one or more die interconnects of the second die to the one or more metal interconnects.

* * * * *